United States Patent
Kotler et al.

(10) Patent No.: US 11,734,549 B2
(45) Date of Patent: Aug. 22, 2023

(54) AVOIDING DATA ROUTING CONFLICTS IN A MACHINE LEARNING ACCELERATOR

(71) Applicant: SiMa Technologies, Inc., San Jose, CA (US)

(72) Inventors: Reed Kotler, San Jose, CA (US); Nishit Shah, Sunnyvale, CA (US)

(73) Assignee: SiMa Technologies, Inc., San Jose, CA (US)

( * ) Notice: Subject to any disclaimer, the term of this patent is extended or adjusted under 35 U.S.C. 154(b) by 625 days.

(21) Appl. No.: 16/854,861

(22) Filed: Apr. 21, 2020

(65) Prior Publication Data
US 2021/0326681 A1 Oct. 21, 2021

(51) Int. Cl.
G06N 3/02 (2006.01)
G06N 3/063 (2023.01)
G06N 20/00 (2019.01)
G06N 3/04 (2023.01)

(52) U.S. Cl.
CPC ............ *G06N 3/063* (2013.01); *G06N 3/04* (2013.01); *G06N 20/00* (2019.01)

(58) Field of Classification Search
CPC ...................................................... G06N 3/02
See application file for complete search history.

(56) References Cited

U.S. PATENT DOCUMENTS

| | | | |
|---|---|---|---|
| 9,928,460 | B1 | 3/2018 | Nowatzyk et al. |
| 2001/0029520 | A1 | 10/2001 | Miyazaki et al. |
| 2005/0257194 | A1 | 11/2005 | Morrow et al. |
| 2013/0297370 | A1* | 11/2013 | Pegden .............. G06Q 10/1097 705/7.26 |
| 2016/0379686 | A1 | 12/2016 | Burger et al. |
| 2017/0103299 | A1 | 4/2017 | Aydonat et al. |
| 2017/0178386 | A1 | 6/2017 | Redshaw et al. |
| 2019/0004878 | A1 | 1/2019 | Adler et al. |

(Continued)

OTHER PUBLICATIONS

Andri et al., "YodaNN: an Architecture for Ultralow Power Binary-Weight CNN Acceleration", IEEE Transactions on Computer-Aided Design of Integrated Circuits and Systems, vol. 37, No. 1, Jan. 2018, pp. 48-60.

(Continued)

*Primary Examiner* — Jae U Jeon
(74) *Attorney, Agent, or Firm* — Fenwick & West LLP

(57) ABSTRACT

A compiler receives a description of a machine learning network (MLN) and generates a computer program that implements the MLN on a machine learning accelerator (MLA). To implement the MLN, the compiler generates compute instructions that implement computations of the MLN on different processing units (Tiles), and data transfer instructions that transfer data used in the computations. The compiler may statically schedule at least a portion of the instructions for execution by the Tiles according to fixed timing. The compiler may initially implement data transfers between non-adjacent Tiles (or external memories) by implementing a sequence of transfers through one or more intermediate Tiles (or external memories) in accordance with a set of default routing rules that dictates the data path. The computer program may then be simulated to identify routing conflicts. When routing conflicts are detected, the compiler updates the computer program in a manner that avoids the conflicts.

21 Claims, 17 Drawing Sheets

(56) References Cited

U.S. PATENT DOCUMENTS

| | | | |
|---|---|---|---|
| 2019/0018815 A1 | 1/2019 | Fleming et al. | |
| 2019/0076031 A1 | 3/2019 | Valys et al. | |
| 2019/0114548 A1 | 4/2019 | Wu et al. | |
| 2019/0155768 A1 | 5/2019 | Wilkinson et al. | |
| 2019/0205737 A1 | 7/2019 | Bleiweiss et al. | |
| 2019/0286973 A1 | 9/2019 | Kowuri et al. | |
| 2019/0303346 A1 | 10/2019 | Brewer | |
| 2019/0391796 A1 | 12/2019 | Brady et al. | |
| 2020/0007342 A1 | 1/2020 | Liem et al. | |
| 2020/0012536 A1 | 1/2020 | Lacey et al. | |
| 2020/0012537 A1 | 1/2020 | Lacey et al. | |
| 2020/0073830 A1 | 3/2020 | Verrilli et al. | |
| 2020/0090383 A1 | 3/2020 | Dwivedi | |
| 2020/0133914 A1 | 4/2020 | Wilkinson et al. | |
| 2020/0150713 A1 | 5/2020 | Knowles et al. | |
| 2020/0272892 A1* | 8/2020 | Desappan | G06N 3/063 |
| 2020/0320403 A1 | 10/2020 | Daga et al. | |
| 2021/0174137 A1 | 6/2021 | Kim et al. | |
| 2021/0197967 A1* | 7/2021 | Song | G08G 5/006 |
| 2021/0201526 A1 | 7/2021 | Moloney et al. | |
| 2021/0240524 A1* | 8/2021 | Gangani | G06F 9/5061 |
| 2021/0278810 A1 | 9/2021 | Heesche et al. | |
| 2022/0044153 A1 | 2/2022 | Madar et al. | |

OTHER PUBLICATIONS

Ankit et al., "PUMA: a Programmable Ultra-efficient Memristor-based Accelerator for Machine Learning Inference", ASPLOS'19, Apr. 13-17, 2019, Providence, RI, USA, pp. 715-731.

Du et al., "ShiDianNao: Shifting Vision Processing Closer to the Sensor", ISCA'15, Jun. 13-17, 2015, Portland, OR, USA, pp. 92-104.

Everson et al., "A 104.8TOPS/W One-Shot Time-Based Neuromorphic Chip Employing Dynamic Threshold Error Correction in 65nm", IEEE Asian Solid-State Circuits Conference Nov. 5-7, 2018/Tainan, Taiwan, pp. 273-276.

Guha, A. et al., "Deepframe: a Profile-Driven Compiler for Spatial Hardware Accelerators," 2019 28th International Conference on Parallel Architectures and Compilation Techniques (PACT), Sep. 23-26, 2019, pp. 68-81.

Jiao et al., "A 12nm Programmable Convolution-Efficient Neural-Processing-Unit Chip Achieving 825TOPS", ISSCC 2020, Session 7, Feb. 18, 2020, 5 pages.

Reuther et al., "Survey and Benchmarking of Machine Learning Accelerators", 2019 IEEE High Performance Extreme Computing Conference (HPEC) Sep. 24-26, 2019, pp. 1-9.

Shawahna et al., "FPGA-Based Accelerators of Deep Learning Networks for Learning and Classification: a Review", IEEE Access, vol. 7, 2019, pp. 7823-7858.

International Search Report and Written Opinion, PCT Patent Application No. PCT/US2021/027998, dated Aug. 25, 2021, 22 pages.

United States Office Action, U.S. Appl. No. 16/865,226, dated Jul. 14, 2022, 12 pages.

United States Office Action, U.S. Appl. No. 16/862,515, dated Aug. 17, 2022, 30 pages.

United States Office Action, U.S. Appl. No. 16/865,226, dated Jan. 13, 2023, 14 pages.

* cited by examiner

AVOIDING DATA ROUTING CONFLICTS IN A MACHINE LEARNING ACCELERATOR

BACKGROUND

1. Technical Field

This disclosure relates generally to the implementation of machine learning networks on hardware.

2. Description of Related Art

Machine learning is one of the most powerful recent trends in technology. In machine learning, a model is developed to perform a certain task. The model, which will be referred to as a machine learning network, is trained and deployed in order to carry out that task. For example, a model may be developed to recognize the presence of objects within images captured by a set of cameras. Once the model is deployed, images captured by the cameras are input to the machine learning network, which then outputs whether (or to what confidence level) objects are present within the images.

Machine learning networks typically require the handling of a large volume of data and the execution of a large number of computations. As a result, they are commonly implemented in compute facilities with access to significant resources, such as in the cloud or on server clusters. However, the sources of input to machine learning networks may be located remotely from these compute facilities. For example, cameras and other types of sensors may be located on the edge of the network. Example applications for edge devices include automotive and other forms of transportation including autonomous transportation, agricultural, industrial, robotics, drones, surveillance and security, smart environments including smart cities, medical, and personalized health. Example tasks include computer vision, image analysis, image understanding, speech recognition, audio analysis, audio understanding, natural language processing, classification and pattern recognition tasks. For edge devices, it may be desirable to perform certain tasks in real-time. In addition to memory and other programmable processors, an edge device may also include sensors, such as cameras (both still image and video cameras), microphones, temperature sensors, pressure sensors and other types of sensors. The sensors may capture samples that are used as inputs to a computing pipeline within the edge device. Thus, one common paradigm is for the input sources to be web-based so that they can continuously send their captured data to the cloud-based compute facility, which then executes the machine learning network and returns the result.

However, there can be many advantages if the machine learning network and computing elements on which it executes was instead embedded on edge devices, such as combined with the camera system.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

A compiler receives a description of a machine learning network (MLN) and generates a computer program that implements the MLN on a machine learning accelerator (MLA). To implement the MLN, the compiler generates compute instructions that implement computations of the MLN on different processing units (Tiles), and data transfer instructions that transfer data used in the computations. The compiler may statically schedule at least a portion of the instructions into one or more deterministic phases for execution by the groups of Tiles. During these deterministic phases, the instructions are executed at predefined timing that is independent of the input data or other configuration parameters. The compiler may initially implement data transfers between non-adjacent Tiles (or external memories) by implementing a sequence of transfers through one or more intermediate Tiles (or external memories) in accordance with a set of default routing rules that dictates the data path. The computer program may then be simulated to identify routing conflicts (e.g., when two or more instructions are scheduled to execute data transfers utilizing the same memory or data path resources at the same time). When routing conflicts are detected, the compiler updates the computer program in a manner that avoids the conflicts. For example, the compiler may re-route one of the conflicting data transfers along a different data path or may change the timing of one of the conflicting data transfers.

Example embodiments of a general MLA system and corresponding compiler that operates at least in part according to static scheduling are described below with respect to FIGS. 1-2. The general MLA system is one example of an architecture in which routing conflicts can be detected and resolved by a compiler in accordance with the techniques described herein. In alternative embodiments, the techniques described herein for conflict detection and resolution during compiling of a computer program can be applied in MLA systems having different architectures and operational structures.

Figure 1:
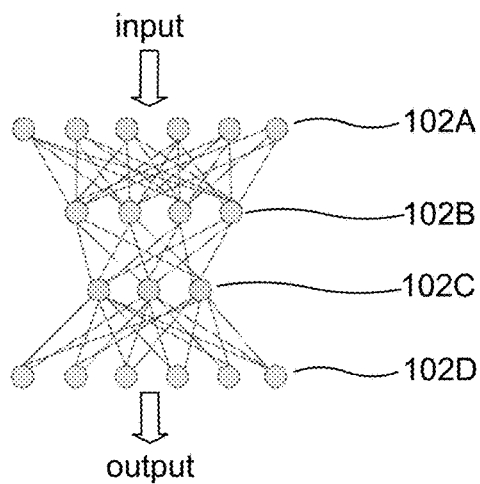
FIG. 1 is a block diagram of a system with a machine learning accelerator (MLA) and corresponding compiler, according to the invention.
Figure 1:
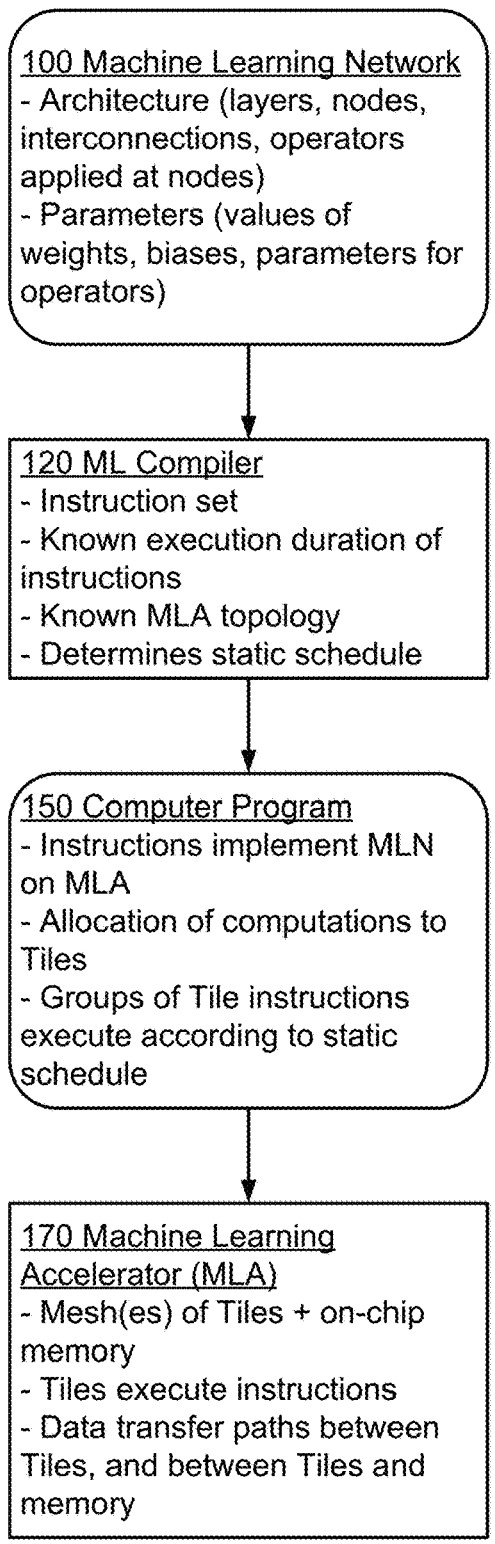
Figure 1:
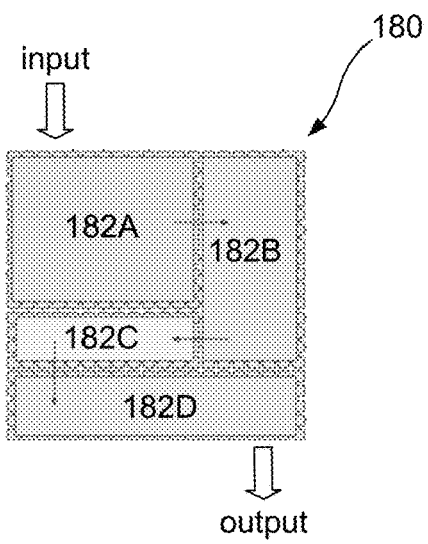

FIG. 1 is a block diagram of one example of a system with an MLA 170 and corresponding compiler 120 in which routing conflicts can be detected and resolved as described herein. The compiler 120 receives a description of a machine learning network 100 and generates a computer program 150 that implements the machine learning network using MLA 170. The computer program 150 includes instructions that are executed by processing elements (Tiles) in the MLA according to a schedule determined by the compiler. For convenience, these will be referred to as statically scheduled instructions. The instructions executed by the Tiles (Tile instructions) are statically scheduled because the compiler can determine which instructions are executed by which Tiles at what times, as will be explained in greater detail below. For example, for the statically scheduled instructions, there are no conditions, branching or data dependencies that can be resolved only at run-time, and which would affect the timing and order of the execution of the instructions. Note that the static schedule determined by the compiler may or may not be included as part of the instructions and computer program. In some embodiments, the computer program may expressly include the schedule, specifying that instruction A is executed at cycle X, instruction B is executed at cycle X+4, instruction C is executed at cycle X+12, etc. In alternate embodiments, the computer program may specify only that instruction A is executed, followed by instruction B, and then instruction C, but without any scheduling information. Even though the static schedule is not expressly specified, these instructions will still execute according to the schedule determined by the compiler because the compiler knows how long it takes to execute each instruction. As a result of the static scheduling, the MLA and instruction set for the MLA may be simplified, with the complexity offloaded to the compiler. A simpler MLA can result in lower cost, lower power consumption and higher performance, all of which are desirable for implementation in edge devices. An example timing diagram for implementing an MLN with statically scheduled instruction is described in further detail below with respect to FIG. 13.

The MLN 100 may be described by an architecture and parameters. A depiction of an MLN is shown to the right of box 100 in FIG. 1. Most MLNs include multiple layers 102, each with one or more nodes which are represented by circles in FIG. 1. The lines between nodes in FIG. 1 represent interconnections between the nodes (and layers). Each node calculates a weighted sum of the values received from its connected nodes, possibly also applying a bias. Examples are matrix multiplication and convolution. Each node may also apply certain functionality (operators), such as nonlinear functions (e.g., tanh function), softmax operator, etc. A typical node may compute an output:

$$y = F(\Sigma w_i x_i + b) \tag{1}$$

where $x_i$ are the inputs received from other nodes i, $w_i$ are weights, b is a bias and F( ) is a nonlinear operator. The MLN architecture includes the number of nodes (and layers) and their interconnectivity, and the operators applied at nodes. The operators may be described in a parameterized form. The MLN parameters include the weights, biases, and parameters for the operators.

MLNs may vary in size, depending on the desired task. Small MLNs may have 5-10 or fewer layers, medium size MLNs may have 30-50 layers, and large MLNs may have 100 or more layers. Examples of inputs include text, images and video. Some of the layers may be fully interconnected (i.e., every node in one layer provides input to every node in the next layer), and others may be more locally interconnected (e.g., to implement convolutions). Each weighted interconnect represents a scalar multiplication. The total number of scalar multiplications required to implement an MLN may be on the order of millions, billions, tens of billions or even more. These may be carried out by matrix multiplications.

The MLA 170 includes a plurality of Tiles 180 and an on-chip memory system implemented on a semiconductor die. The Tiles are organized into one or more meshes of interconnected Tiles. A depiction of a Tile mesh is shown to the right of box 170 in FIG. 1. In each mesh, the Tiles 180 are organized in a regular pattern and the interconnections within each mesh provide data transfer paths between Tiles in the mesh. The Tiles execute computations according to instructions received by the Tiles and using data stored in the on-chip memory system. These instructions may be for computations and/or for data transfer. Computations include multiply (including matrix multiply), add, and operators (e.g., nonlinear functions, lookup table, min/max, pooling). These are computations that implement the MLN. In the example of FIG. 1, the computations performed by layers 102A-D are allocated to groups 182A-D of Tiles as indicated. The allocation is not required to be 1:1. For example, multiple layers could be allocated to a single Tile or vice versa. Not every computation required to implement an MLN need be executed by a Tile; some computation may be executed outside the MLA (e.g., floating point operations, if the Tiles only do integer arithmetic). Tiles typically will at least perform matrix multiplication.

The compiler 120 receives a description of the MLN 100 and generates a computer program 150 that implements the MLN using the MLA 170. The computer program 150 receives an input sample for the MLN and executes the operations of the MLN to produce the output for the MLN. The computer program 150 includes instructions to be executed by the Tiles for implementing computations in the MLN and may also include instructions to be executed by other elements, such as a controller outside the Tiles.

Figure 2A:
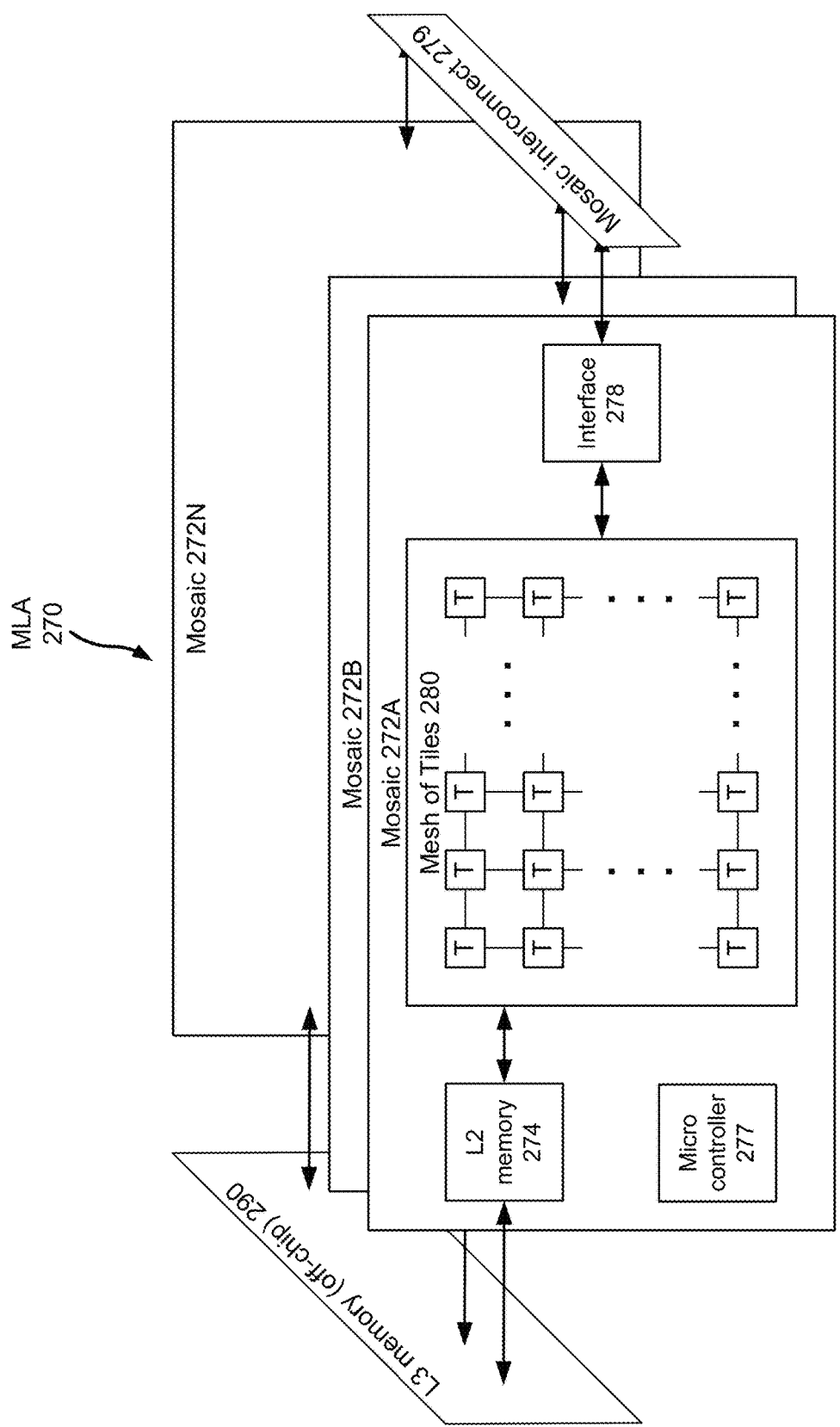
FIG. 2A is a block diagram of a hardware system including an MLA.

FIG. 2A is a block diagram of a hardware system including an MLA 270. The MLA 270 includes all the components shown in FIG. 2A, except the off-chip L3 memory 290. The MLA components are implemented on a single die as part of a single chip. The MLA 270 includes one or more mosaics 272A-N. In this example, all of the mosaics are the same. Each mosaic 272 includes a mesh of Tiles 280, an on-chip memory system and a controller 277. In FIG. 2A, the on-chip memory system is a multi-level memory system, which includes a level 1 (L1) memory distributed among the Tiles (see FIG. 2B) and a level 2 (L2) memory 274 shared by the Tiles. If there are multiple mosaics 272, the MLA 270 may include a dedicated interconnect 279 for connecting the different mosaics. Each mosaic also includes an interface 278 to the interconnect 279.

Figure 2B:
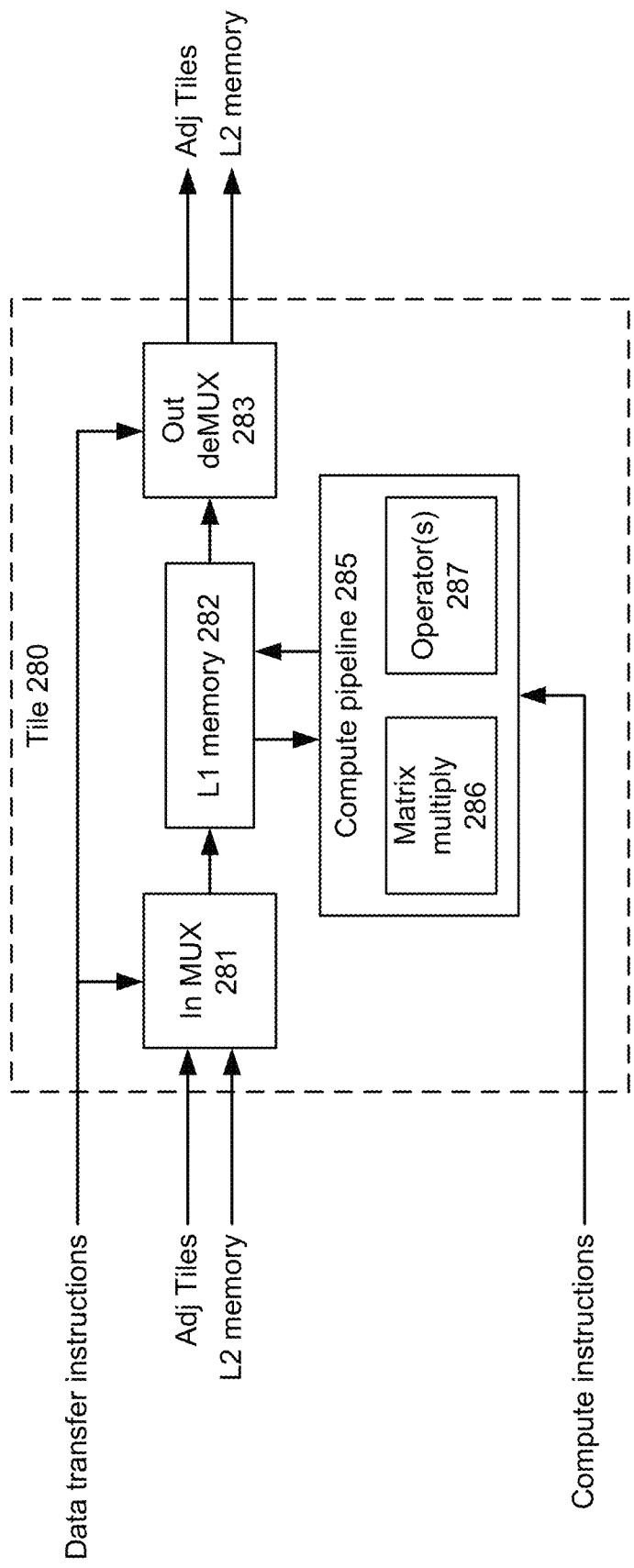
FIG. 2B is a block diagram of a Tile within an MLA.

FIG. 2B is a block diagram of a Tile 280 within the MLA. In this example, all the Tiles are the same. Each Tile 280 includes an L1 memory 282. Each Tile 280 also includes a data transfer pipeline that executes instructions for transferring data to and from the L1 memory 282. Here, the Tiles 280 are arranged in a rectangular array as shown in FIG. 2A, with each Tile connected to its adjacent neighbors. Interior Tiles are connected to four adjacent Tiles. Edge Tiles are connected to adjacent Tiles and also to L2 memory 274. In FIG. 2B, the L1 memory 282 may receive data from any of its adjacent Tiles and/or from L2 memory if it is an edge Tile. Similarly, it may transfer data to any of its adjacent Tiles and/or to L2 memory if it is an edge Tile. The data transfer operations are controlled by data transfer instructions received and executed by the Tiles.

Each Tile 280 also includes a compute pipeline 285 for executing computations using data stored in the L1 memory 282. The L1 memory acts as software-configurable registers for the compute pipeline 285. The compute pipeline 285 includes matrix multiplication circuitry 286, such as a systolic array, and circuitry for implementing different types of operators 287. The computations are controlled by compute instructions received and executed by the Tiles.

In this particular example, all of the data transfer instructions and compute instructions executed by the Tiles are statically scheduled. These instructions include data transfer between L1 memories in different Tiles, and data transfer between L1 memory and L2 memory. Data transfer instructions may specify one hop at a time (e.g., transfer data to the east neighbor Tile) or may specify destination and path through intermediate Tiles (e.g., transfer data to Tile (5,5) using path east-east-north-north-east). The instructions also include matrix multiplies performed by the Tiles and operators applied by the Tiles. These operations do not require very many different instructions to implement, so the overall instruction set may be fairly small, for example not more than 20 instructions, or not more than 50 instructions.

The L3 memory 290 is off-chip. In this example, the L1 and L2 memories are implemented as on-chip SRAM and the L3 memory is implemented as DRAM (flash memory and SSD drives are other alternatives). Because the L1 and L2 memories are implemented as SRAM, the data transfers between L1 memories or between L1 and L2 memories have deterministic timing, so these data transfer instructions can be statically scheduled by the compiler. However, data transfer from off-chip DRAM is more unpredictable in timing. As a result, these instructions are non-deterministic in nature and they are executed by the microcontroller 277. Therefore, they are executed in one of the non-deterministic phases and they are not statically scheduled.

In one approach, the instructions in the computer program and the data required for computation (e.g., input, weights, biases, parameters for operators) are initially loaded into L3 memory 280. From time to time, instructions and associated data are transferred from L3 memory into L1/L2 memory during a non-deterministic phase since the timing of data transfers from DRAM is not deterministic. Once these instructions and data are loaded into L1/L2 memory, the computer program enters a corresponding deterministic phase in which the Tiles execute the loaded instructions according to a static schedule. The non-deterministic and deterministic phases may occur concurrently. For example, data may be continuously streamed into the L1/L2 memory during the non-deterministic phase, with the corresponding statically scheduled instructions from the deterministic phase consuming that data. In one approach, the Tiles execute only statically scheduled instructions, and all non-statically scheduled instructions are executed by processing elements outside the Tile mesh, for example, the microcontroller 277.

SRAM has known timing so implementing the L1 and L2 memories as SRAM allows the compiler to statically schedule data transfers from those memories into the Tiles for computation. However, there is a limit to the amount of SRAM that may be implemented on a die. In order to increase the effective size of SRAM, a virtual SRAM approach may be used. In one approach, the compute instructions that consume certain data are not fetched into the Tiles until after the corresponding data have been transferred from DRAM (L3 memory) to SRAM (L1/L2 memory). This guarantees that the compute instructions will not be executed by the Tiles before the data is available. All data effectively will appear as if it is transferred to the Tiles from SRAM for computation, even if all of the data would not fit into the available SRAM.

L2 memory may also be used to temporarily store interim values that are too voluminous to store in L1 memory. For example, a layer K of the MLN may produce a large amount of data at its output, to be used as input to the next layer K+1. The layer K output may be stored in L2 memory and then retrieved from L2 memory as needed for the next layer's computations. This may be implemented using a ping pong buffer approach when multiple input samples are processed as a pipeline. The L2 memory is divided into two regions A and B. When a first input sample is processed, the layer K output is stored in region A of the L2 memory. The computations for layer K+1 retrieve the stored values from region A. At the same time, the second input sample is processed and the layer K output is stored in region B of the L2 memory. The two regions then alternate, with the Tiles implementing layer K storing to one region while the Tiles implementing layer K+1 read from the other region. The synchronization is implemented by the static scheduling. The compiler knows when regions AB will be ready and the instructions to implement layer K+1 will execute after that time. No synchronization primitives are needed.

FIGS. 3A-D illustrate example embodiments of techniques for routing data between respective memories using the MLA architecture described above. In FIGS. 3A-D, the square boxes represent L1 memories, which may be distributed throughout the MLA. The elongated rectangular boxes represent L2 memories which may be shared between Tiles. In the MLA architecture of FIG. 2, each Tile includes one and only one integrated L1 memory. Therefore, if the MLA architecture of FIG. 2 is used, the square boxes may equivalently represent Tiles. As described in FIGS. 7-12 discussed below, alternative embodiments may include different configurations of memories and Tiles including embodiments in which a single Tile has multiple L1 memories, or in which a single L1 memory is shared between multiple Tiles.

In the illustrated examples of FIGS. 3A-D, data is transferred between an L1 memory 302 of a source Tile and an L1 memory 304 of a destination Tile. In other cases, data may be similarly transferred from an L2 memory to an L1 memory of a Tile, from an L1 memory of a Tile to an L2 memory, or between different L2 memories. In the illustrated example, the MLA is configured to have data paths available only between adjacent Tiles and between the L2 memories and the Tiles directly to adjacent to those L2 memories. For example, a given Tile may have four available data paths including to the Tile or L2 memory immediately above, immediately below, immediately to the left, or immediately to the right of the given Tile. In alternative embodiments, different configurations of data paths may be available. For example, in an alternative embodiment, direct data paths may also exist diagonally to the upper-right, upper-left, lower-right, and lower-left of a given Tile. In yet further embodiments, additional data paths may be available between Tiles and/or L2 memories that are not necessarily adjacent. In yet further embodiments, at least some data paths may be unidirectional. For example, a first Tile may have a data path to transfer data to a second Tile, but the second Tile does not have a direct data path to transfer data to the first Tile. Additional examples of data path configurations are described in relation to FIGS. 7-12.

As illustrated in the various examples of FIGS. 3A-3D, data may be transferred indirectly between memories (L1 memories of Tiles and/or L2 memories) by performing a sequence of data transfers along available data paths from a source memory 302 to a destination memory 304. Here, at each time period t, data is transferred from a memory to an adjacent memory until it reaches the destination memory 304. The time periods t are not necessarily the same length and different time periods t may comprise different numbers of instruction cycles.

Figure 3A:
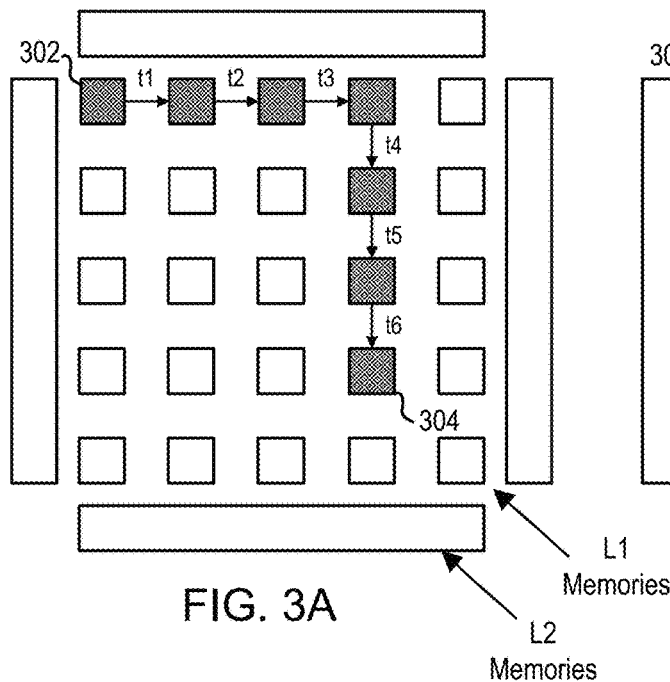
FIG. 3A is a first example of a default routing path for transferring data from a source memory to a destination memory in an MLA.
Figure 3B:
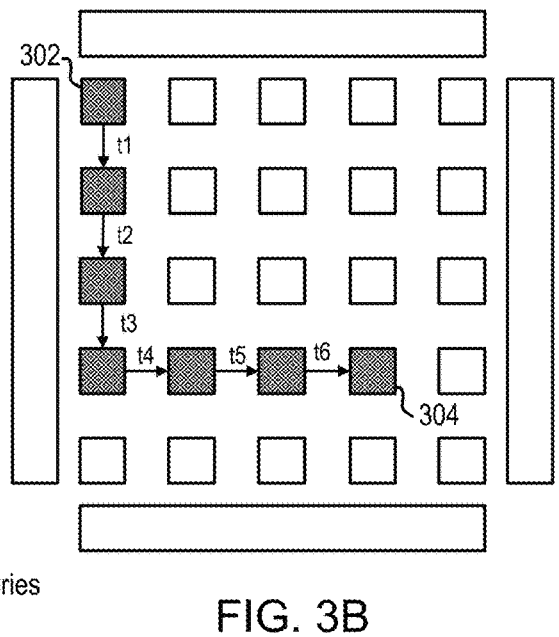
FIG. 3B is a second example of a default routing path for transferring data from a source memory to a destination memory in an MLA.
Figure 3C:
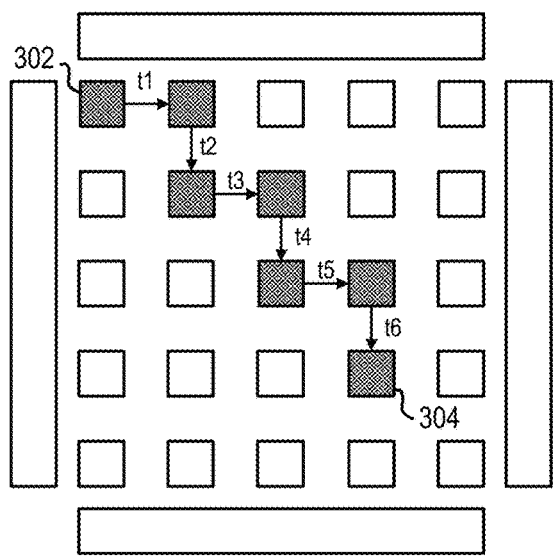
FIG. 3C is a third example of a default routing path for transferring data from a source memory to a destination memory in an MLA.
Figure 3D:
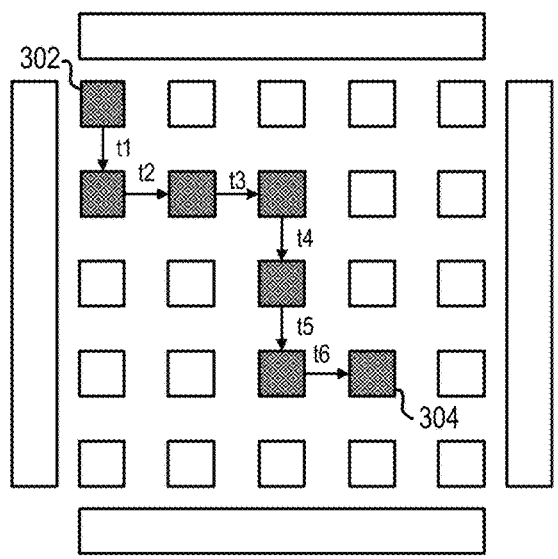
FIG. 3D is a fourth example of a default routing path for transferring data from a source memory to a destination memory in an MLA.

The compiler 120 may implement the data transfer according to a specific data path based on a set of default routing rules. In an embodiment, the default routing rules may implement the data transfer along a path utilizing the minimum number of steps between the source memory 302 and the destination memory 304 given the available connections between the memories. For example, in each of the examples of FIGS. 3A-D connections are available in four directions (up, down, left, right) and each transfer is implemented in the minimum number of steps (six steps in these examples). In the case that multiple paths can be taken in the minimum number of steps, the default routing rules may furthermore control which of the possible paths is taken. In the example of FIG. 3A, the default routing rules dictate that data is first transferred along a horizontal path until it reaches a column of the destination memory 304, and the data is then transferred along a vertical path to the destination memory 304. In the example of FIG. 3B, the default routing rules dictate that the data is first transferred along a vertical path until it reaches a row of the destination memory 304, and is then transferred along a horizontal path to the destination memory 304. In the example of FIG. 3C, the default routing rules may dictate that at each step, data is transferred in the horizontal direction if a distance to the column of the destination memory 304 is greater than or equal to the distance to the row of the destination memory 304, and the data is transferred in the vertical direction if the distance to the row of the destination memory 304 is greater than the distance to the column of the destination memory 304, resulting in the step pattern of FIG. 3C. In the example of FIG. 3D, the default routing rules may randomly select between transferring data in the horizontal or vertical directions (within the constraint that the data moves a step closer to the destination memory at each step), thus resulting in the arbitrary data path of FIG. 3D. In other alternative embodiments, the default routing rules may result in different default routing paths between a source memory 302 and a destination memory 304.

In further embodiments, the default routing rules do not necessarily minimize the number of data transfer steps between the source memory 302 and the destination memory 304. For example, in some embodiments, the default routing rules may select a data path that favors transfers between L1 memories over transfers to and from L2 memories, even if it results in more steps. In other embodiments, the default routing rules may be designed to limit transfers through L1 memories of Tiles having a particularly high computational burden. In other embodiments, the default routing rules may be configured according to customizable parameters that may be set by the compiler 120.

Figure 6A:
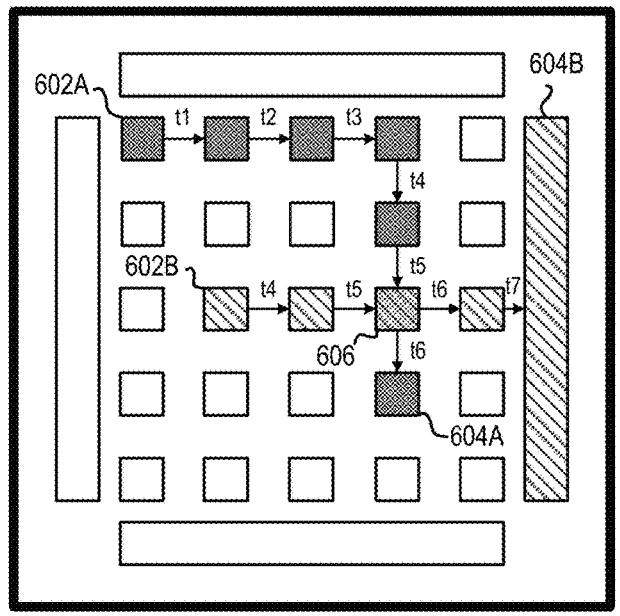
FIG. 6A is a first example of a routing conflict that can occur when data transfers are scheduled in an MLA according to default routing rules.

While FIGS. 3A-D illustrate examples of a single data transfer from a source memory 302 to a destination memory 304, multiple such data transfers may occur concurrently or during overlapping time periods during implementation of an MLN. This may result in a routing conflict if more than one data transfer is scheduled to utilize the same data path at the same time. An example of such a routing conflict is illustrated in FIG. 6A. Here, a first data transfer is scheduled between a first source memory 602A and a first destination memory 604A during a time period $t_1$-$t_6$. A second data transfer is scheduled between a second source memory 602B a second destination memory 604B during a time period $t_4$-$t_7$. Both data transfers are scheduled to utilize a data path involving the same memory 606 at time $t_5$, thus resulting in a conflict. In an embodiment, the MLA does not include a mechanism for run-time arbitration or contention resolution in the case that two or more transfers are scheduled to utilize the same data transfer path at the same time. Thus, rather than rely on the MLA resolving routing conflicts at runtime, the compiler 120 may instead ensure that such routing conflicts are avoided by statically scheduling data transfer instructions in a manner that avoids such conflicts.

Figure 4:
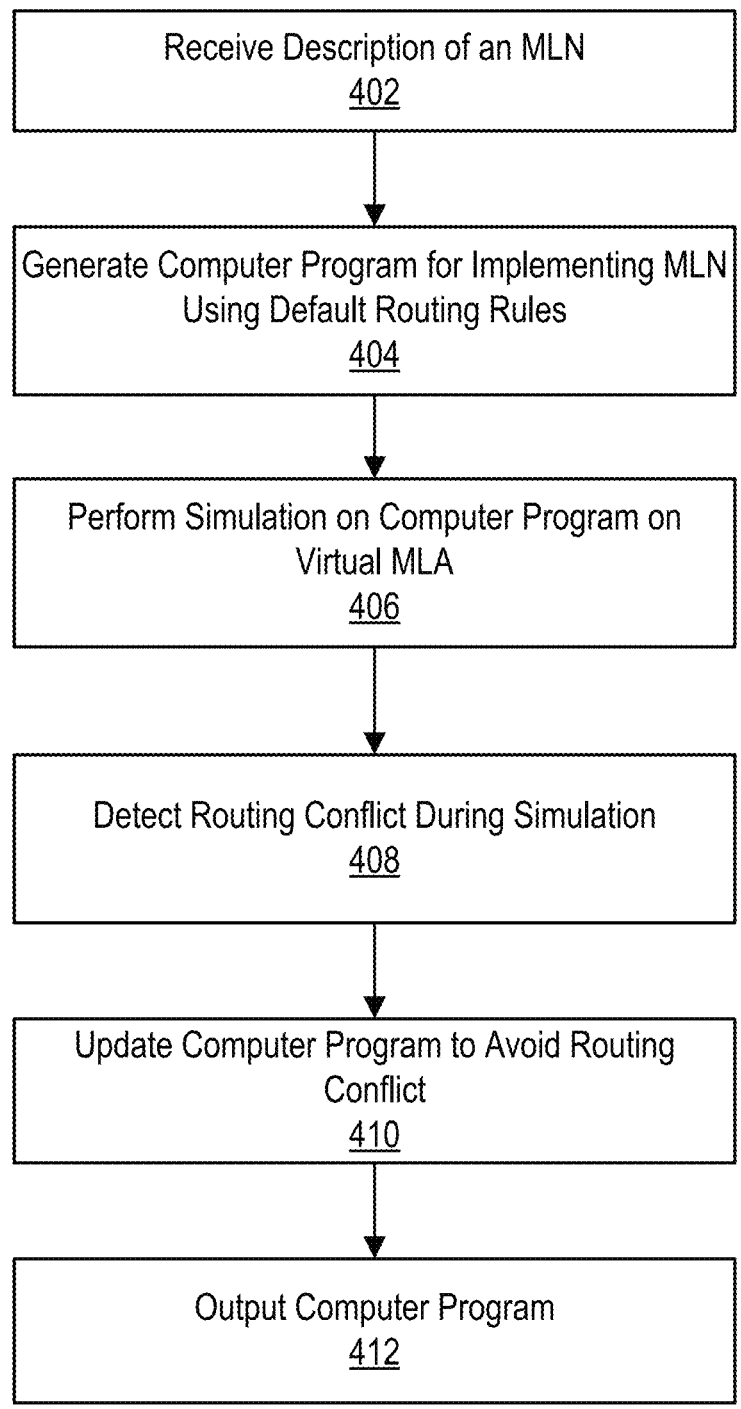
FIG. 4 is a flowchart illustrating an example embodiment of a process for generating a computer program for implementing an MLN that is free of routing conflicts.

FIG. 4 illustrates an example embodiment of a process for generating a computer program to implement an MLN on an MLA in a manner that avoids routing conflicts during data transfers. A compiler 120 receives 402 a description of an MLN. The compiler 120 generates 404 a computer program for implementing the MLN that uses default routing rules to implement the data transfers. The default routing rules may be based on any of the examples described above in FIGS. 3A-D, or the compiler 120 may utilize different default routing rules. The default routing rules may control which direction the data is transferred at each step, and in some cases, may be configured to implement the transfer in the minimum number of possible steps. After generating the computer program, the compiler 120 performs 406 a simulation of the computer program on a virtual MLA (e.g., using a software simulator as described in further detail below). Routing conflicts are detected 408 during the simulation. For example, the compiler 120 may detect when the computer program includes multiple data transfer instructions for transferring data into the same memory during the same clock cycle. Additionally, the compiler 120 may detect when the computer program includes instructions to transfer data into a memory during a cycle when the memory is occupied by other data scheduled to be operated on in a later cycle. For example, the compiler 120 may detect that the currently stored data has not yet been copied elsewhere or operated on and that the data cannot be overwritten without causing an error in the implementation of the MLA. In other embodiments, the compiler 120 may detect when the computer program includes instructions to execute two or more data transfers on the same interconnect at the same time.

In an embodiment, the simulation does not necessarily require executing all of the instructions of the computer program. Furthermore, the simulation does not necessarily require applying the instructions to actual data of an MLN. Rather, in some embodiments, performing the simulation may involve identifying transfer instructions in the computer program and generating a map of the timing of each transfer step based on the static scheduling parameters. For example, the map may indicate, for each data transfer, which memories the data is transferred to and/or from at each instruction cycle. The compiler 120 may then determine if routing conflicts exist based on the mapping without fully executing all of the instructions during the simulation.

In an alternative embodiment, the compiler 120 may instead detect the routing conflicts using a hardware emulator (as described in FIG. 14 below) instead of a software simulator. Routing conflicts may be detected based on monitored signals in the hardware emulator and resolved in the same manner described below. In yet another alternative embodiment, the compiler 120 may provide the computer program to an MLA and monitor execution of the computer program on the MLA to detect routing conflicts and update the computer program accordingly.

The compiler 120 updates 410 the computer program in a manner that avoids the routing conflict. For example, the compiler 120 may change the timing of one or more of the conflicting data transfers or the routing path of one or more of the conflicting data transfers. Examples of techniques for modifying data transfers to avoid detected routing conflicts are described in further detail below with respect to FIGS. 6-9.

In an embodiment, the compiler 120 may perform the update to the computer program iteratively. For example, in a first iteration, the compiler 120 may modify one or more data transfer instructions to avoid a routing conflict, but these changes to the computer program may cause a different routing conflict. The compiler 120 may then iteratively re-simulate the computer program and perform additional updates until the compiler 120 is able to complete the simulation without routing conflicts occurring. The compiler 120 then outputs 412 the computer program for implementation on the MLA. For example, the compiler may write the computer program to a non-volatile memory device from which the computer program can be loaded by a controller associated with the MLA at run-time.

Figure 5:
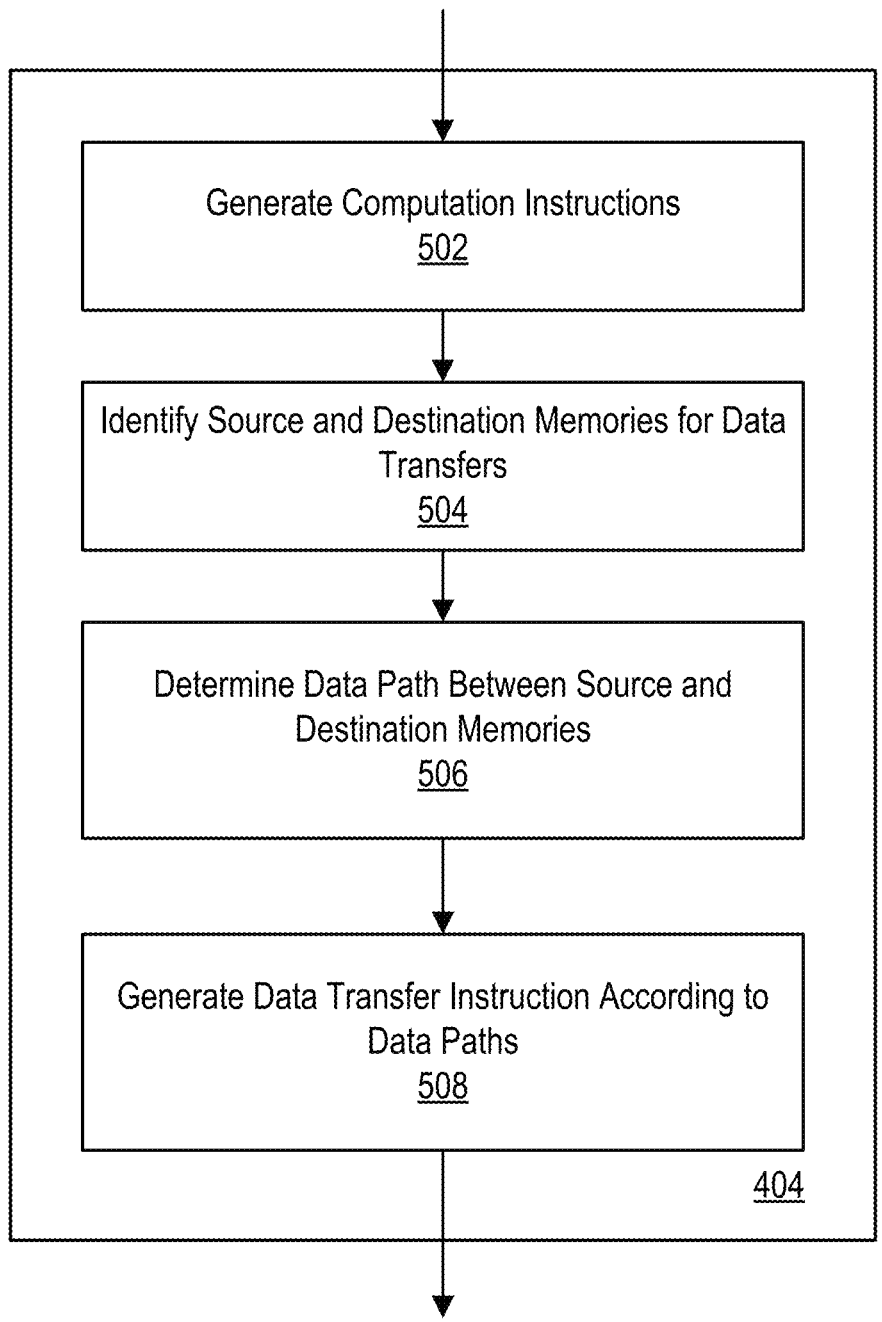
FIG. 5 is a flowchart illustrating an example embodiment of a process for generating a computer program for implementing an MLN using default routing rules.

FIG. 5 illustrates an example embodiment of a process for generating a computer program to implement the data transfers. The compiler 120 initially generates 502 computation instructions based on the MLN. Here, the computation instructions perform the computations for implementing the MLN and may be assigned to specific Tiles for executing the computation instructions at specific cycle times. The compiler 120 identifies 504 source and destination memories for a set of data transfers that enable the Tiles to obtain the data associated with each computation at the scheduled times. For example, the compiler 120 may determine that in order for a Tile $T_A$ to perform a computation C, it must first obtain first data X from a source Tile $T_B$ and second data Y from a second source memory of a Tile $T_C$. For each of the data transfers, the compiler 120 determines 506 a data path between the source and destination memories. In the case that the source and destination memories are non-adjacent and do not have a direct data path available between them, the compiler 120 may determine a data path that comprises a sequence of transfers through one or more intermediate memories (e.g., L1 memories of Tiles and/or L2 memories). Examples of these data paths and default routing rules for determining data paths for each transfer were described in relation to FIGS. 3A-D above. The compiler 120 generates 508 data transfer instructions according to the determined data paths to implement the data paths.

Figure 6B:
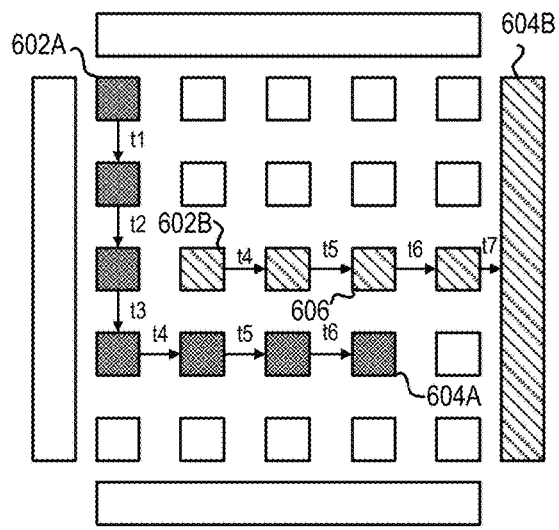
FIG. 6B is a first example of a resolution to the routing conflict based on re-routing of one of the conflicting data transfer paths.
Figure 6C:
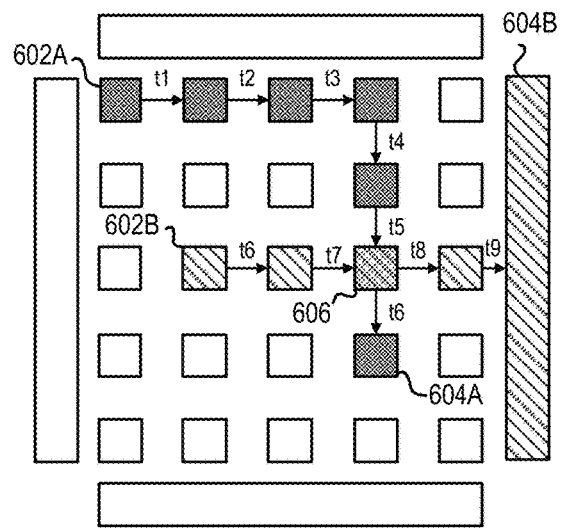
FIG. 6C is a second example of a resolution to the routing conflict based on changing timing of one of the conflicting data transfers.
Figure 6D:
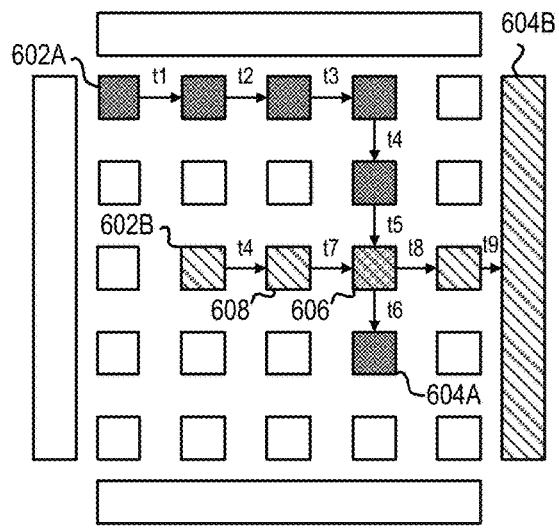
FIG. 6D is a third example of a resolution to the routing conflict based on adding idle instructions to delay one of the conflicting data transfers.

FIG. 6A, which is described in further detail above, illustrates an example of a routing conflict that may be detected when the initial computer program is simulated. As described above, the routing conflict occurs because the data from the source memory 602A and the data from the source memory 602B are scheduled for transfer according to respective data paths that both pass into memory 606 at time $t_5$. FIGS. 6B-6D illustrate various techniques for resolving the routing conflict of FIG. 6A. In FIG. 6B, the routing conflict is resolved by updating the computer program to re-route the data transfer between the source memory 602A and the destination memory 604A along a different path that does not involve a transfer through the L1 memory 606. In this case, both data transfers can still be completed in the minimum number of steps and thus no additional latency is incurred in resolving the conflict. In FIG. 6C, the routing conflict is resolved by changing the timing of the data transfer between source memory 602B and destination memory 604B. Here, instead of beginning the transfer from source memory 602B at time $t_4$, the transfer instead is initiated at the $t_6$. This transfer thus reaches the memory 606 at time $t_7$ instead of $t_5$, and by this time, the data from source memory 602A has already passed through the memory 606. The timing change of FIG. 6C may be implemented, for example, by swapping timing of a one or more instructions that involves the transfer from the memory 602B to the memory 604B with one or more other instructions that may utilize one or more of the same Tiles. If possible, the compiler 120 may swap instructions or blocks of instructions that can be performed in either order without delaying downstream instructions dependent on the resulting data, thereby enabling resolution without affecting overall latency or the result of the MLN.

In alternative embodiments, a more complex re-ordering involving more than two instructions or blocks of instructions may be performed to resolve the conflict in a manner that does not increase overall latency or the result of the MLN. For example, while some instruction are subject to a set of partial ordering constraints (e.g., an instruction to transfer data to an L1 memory of a Tile must be performed before the Tile can operate on that data), there can be many different exact instruction sequences that still satisfy the partial ordering constraints. For example, in some cases, a move instruction for transferring data to an L1 memory of a Tile can be started much earlier than when the results are scheduled to be operated on by the Tile to avoid a later routing conflict. Alternatively, as in the example of FIG. 6C, the data transfer may be delayed relative to the original schedule without affecting the overall result or latency if it can still be completed in time for the Tile to perform the computation on schedule.

In other cases, the compiler 120 may operate to minimize added latency to resolve the conflict in the case that adding some additional cycle times is not avoidable.

FIG. 6D illustrates another alternative technique for resolving the routing conflict of FIG. 6A. In this example, the routing conflict is avoided by holding the data from the source memory 602B at an intermediate memory 608 for extra cycles until the data transfer path to the destination memory 604B is cleared. In an embodiment, this technique may be implemented by generating one or more idle instructions (e.g., NO-OP or nop instructions) for execution by the Tile associated with memory 608 prior to the data instruction to cause the Tile to idle for one or more extra cycles before the data transfer instruction executes.

In an embodiment, the compiler 120 may select between different options for resolving a conflict based on preconfigured preferences. For example, in one embodiment, the technique of FIG. 6B (re-routing) may be preferred if possible if it can be performed without adding additional latency, and other techniques are employed only if the compiler 120 cannot resolve the conflict in this way. Furthermore, the compiler 120 may give preference to a resolution like the one in FIG. 6C in which blocks of instructions can be re-ordered in a manner that does not add additional latency over the technique of FIG. 6D in which a Tile is forced to idle for one or more instructions to resolve the conflict.

FIGS. 7-9 illustrate additional examples of routing conflicts and resolutions to those routing conflicts under a different type of MLA architecture in which the memories (which may be L1 memories of Tiles or L2 memories) each have multiple ports 702A, 702B that enable different partitions of the memories to be written to concurrently. Thus, in contrast to the example of FIGS. 3A-3D described above in which an L1 or L2 memory can only be accessed by one other Tile at a given time, the examples of FIGS. 7-9 include architectures that enable a given memory to be accessed by two different Tiles at a given time by utilizing separate memory ports.

Figure 7A:
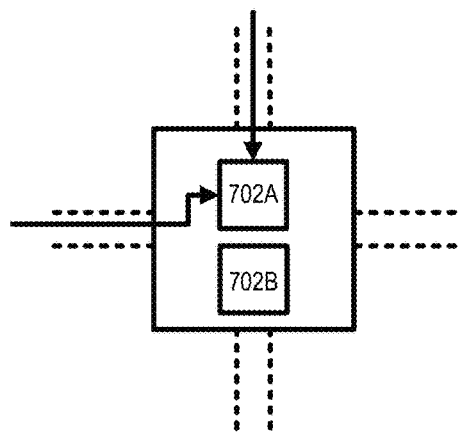
FIG. 7A is an example of a routing conflict that can occur when data transfers are scheduled in an MLA according to default routing rules in an MLA having switchable multi-port memories.
Figure 7B:
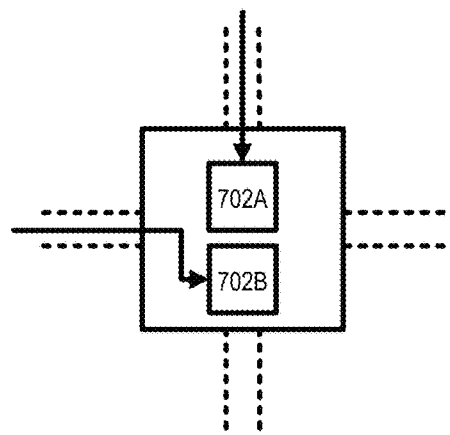
FIG. 7B is an example of a resolution to the routing conflict of FIG. 7A based on re-routing of one of the conflicting data transfer paths using a different memory port.

In the example of FIGS. 7A-7B, a switch or demultiplexer selectively connects each data channel to one of the two memory ports 702A, 702B. Thus, a data channel can selectively write or read from either memory port 702A or 702B at a given time, but a given memory port cannot be accessed by two different Tiles at the same time. In the example of FIG. 7A, two Tiles are each scheduled to write to the same memory port 702A of a destination memory at the same time, thus resulting in a routing conflict. FIG. 7B illustrates a resolution of this routing conflict in which one of the data transfers is re-routed to a different port 702B of the destination memory that can be written to concurrently with port 702A. Thus, the routing conflict can be resolved while enabling both data transfers to pass through the same Tile at the same time, using different ports 702A, 702B and partitions of the memory. Alternatively, the conflict of FIG. 7A could be resolved using any of the techniques described above (e.g., routing through different memories or changing the timing of one or more of the conflicting transfers).

Figure 8A:
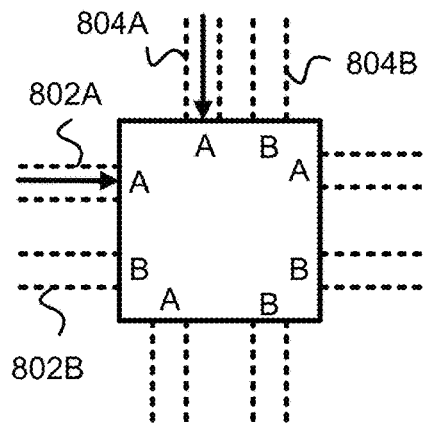
FIG. 8A is an example of a routing conflict that can occur when data transfers are scheduled in an MLA according to default routing rules in an MLA having multiport memories with dedicated data channels.
Figure 8B:
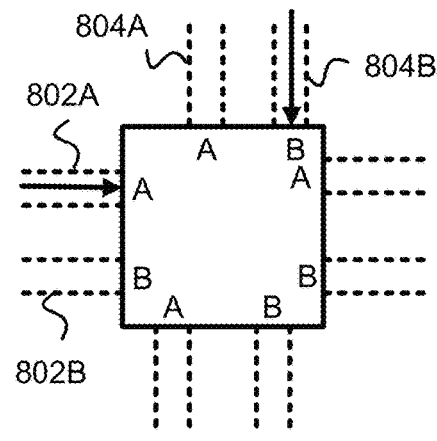
FIG. 8B is an example of a resolution to the routing conflict of FIG. 8A based on re-routing of one of the conflicting data transfer paths using a different data channel and corresponding memory port.

FIGS. 8A-8B illustrate yet another example of a routing conflict and a resolution to that routing conflict, respectively, under another type of MLA architecture. In this MLA architecture, the memories (which may be L1 memories of Tiles or L2 memories) each have multiple ports (e.g., ports A and B) that enable different partitions of the memories to be written to concurrently. In contrast to FIGS. 7A-7B, instead of a switch that selectively connects a data channel to one of the two ports, each connection to an adjacent memory instead includes multiple dedicated channels 802A, 802B (e.g., one dedicated channel for each port). Thus, two different ports A, B can be accessed at the same time by two different Tiles using their respective dedicated channels 802A, 802B, but two different Tiles still cannot access the same memory port at the same time. In FIG. 8A, a first Tile is scheduled to write to port A of the memory via data channel 802A, and a second Tile is scheduled to write to port A of the memory via the data channel 804A at the same time, thus creating a conflict at the port A. In FIG. 8B, the data transfer instructions of one of the Tiles is updated to instead write to port B using the dedicated channel 804B. Thus, the conflict can be avoided. Alternatively, the conflict of FIG. 8A could be resolved using any of the techniques described above (e.g., routing through different memories or changing the timing of one or more of the conflicting transfers).

Figure 9A:
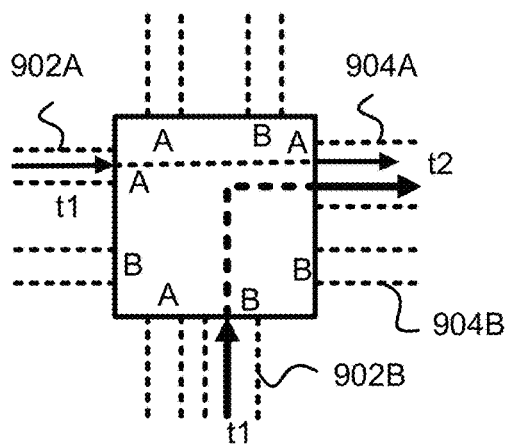
FIG. 9A is another example of a routing conflict that can occur when data transfers are scheduled in an MLA according to default routing rules in an MLA having multiport memories with dedicated data channels.
Figure 9B:
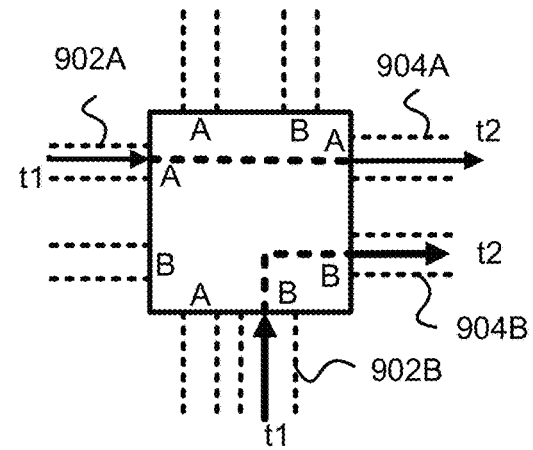
FIG. 9B is an example of a resolution to the routing conflict of FIG. 9A based on rerouting one of the conflicting data transfer path using a different data channel and corresponding memory port.

FIGS. 9A-9B illustrate yet another example of a routing conflict in an MLA architecture similar to the architecture of FIGS. 8A-8B described above. In this example, a conflict occurs while transferring data out of the memory instead of when transferring data into the memory. Specifically, in the example of FIG. 9A, a first data transfer path involves writing to the memory via port A from a source data channel 902A at a time $t_1$ and outputting data from the memory port A to a destination data channel 904A at a time $t_2$. A second data transfer path involves writing to the memory via port B from a source data channel 902B at a time $t_1$ and outputting data from the memory port A to the destination channel 904A at time $t_2$. Here, no conflict exists at time $t_1$ when the data is inbound to the memory because data is inputted using different memory ports. However, a conflict exists at time $t_2$ when the data is outbound from the memory because the memory is scheduled to output data for two different data transfers on the same channel 904A at the same time $t_2$. FIG. 9B illustrates a resolution to the conflict in which the data from the source data channel 902B is re-routed at time $t_2$ to be outputted using port B and the destination data channel 904B. Alternatively, this routing conflict can similarly be resolved using any of the techniques of FIGS. 6A-D described above (e.g., routing through different memories or changing the timing of one or more of the conflicting transfers).

While the examples of FIGS. 7-9 relate to MLA architectures with two-port memories, similar principles for detecting and resolving routing conflicts can similarly be applied for MLA architectures using memories with three or more memory ports per memory.

FIGS. 10-12 illustrate additional alternative mesh configurations for an MLA. While these configurations employ different available data paths between memories, the same principles described above may be utilized to resolve routing conflicts in any of these alternative mesh configurations.

In the previous described examples, the Tiles in the mesh all had the same capability. Each Tile had a compute pipeline that could perform matrix multiplication and implement certain operators. Each Tile also had a data transfer pipeline to transfer data to and from its local L1 memory. This was just an example. FIGS. 10A-10D are block diagrams of meshes in which the Tiles have different capabilities.

Figure 10A:
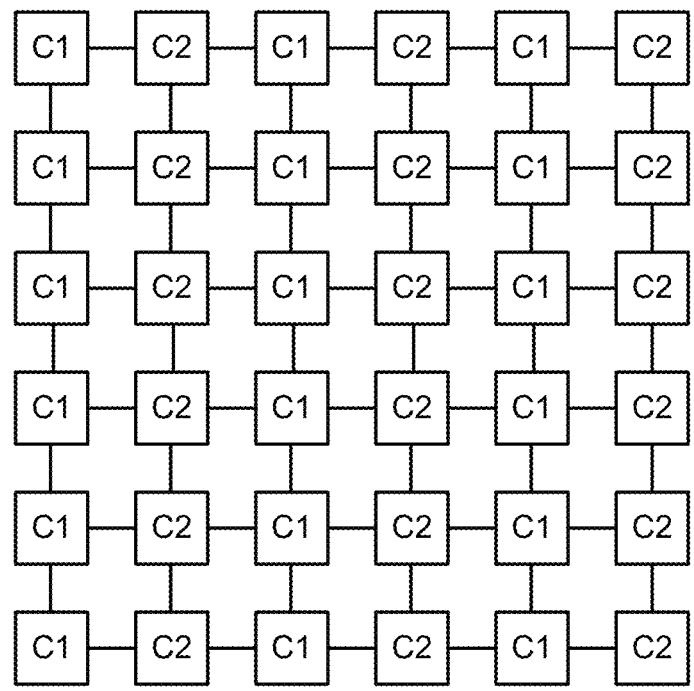
FIGS. 10A-10D are block diagrams of meshes in which the Tiles have different capabilities.
Figure 10B:
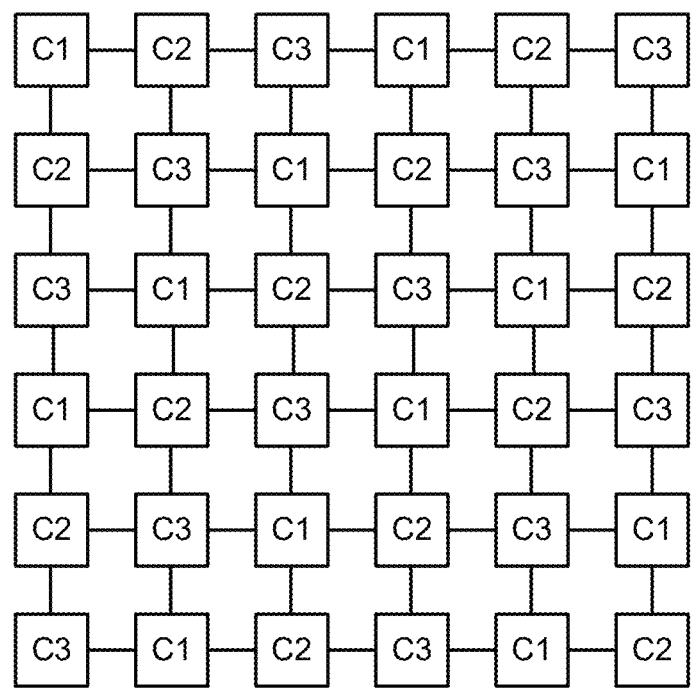

In the mesh of FIG. 10A, there are two different types of Tiles labeled C1 and C2. The C1 Tiles have one type of compute capability and the C2 Tiles have a different type of compute capability. For example, the C1 Tiles may be limited to matrix multiplication while the C2 Tiles apply certain operators (i.e., the different stage of the compute pipeline 285 in FIG. 2B is split into separate Tiles). In FIG. 10A, the Tiles are arranged in columns which alternate between the C1 and C2 capabilities. This may be a good layout for data flowing left to right, since it is common for MLNs to have matrix multiplications followed by operators. In the mesh of FIG. 10B, there are three types of tiles C1, C2 and C3. The Tiles are arranged in diagonals, so that no Tile is adjacent to another Tile with the same capability.

Figure 10C:
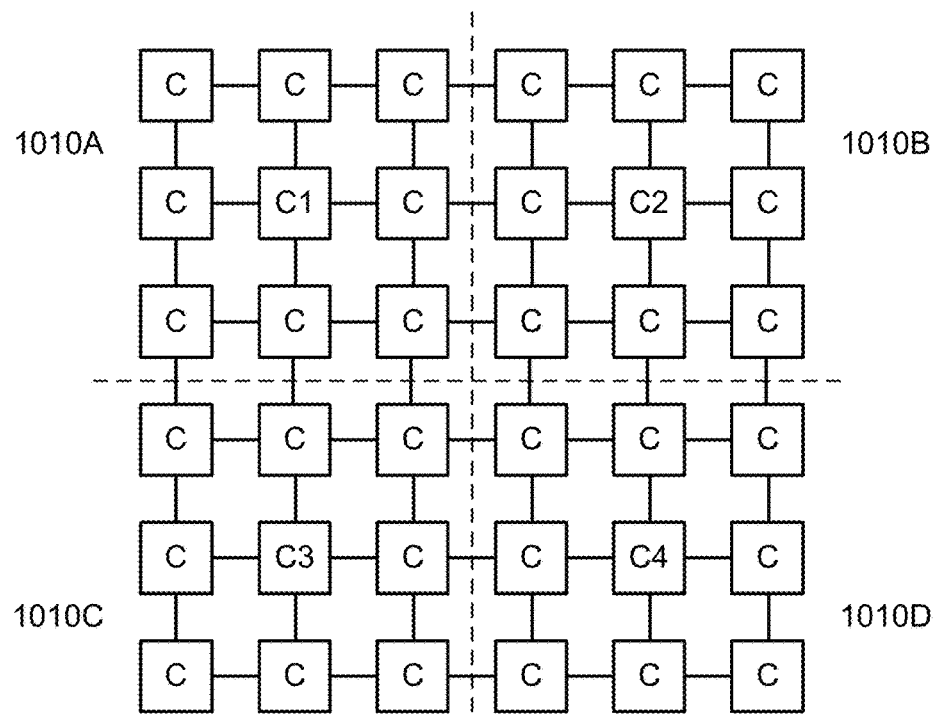
Figure 10D:
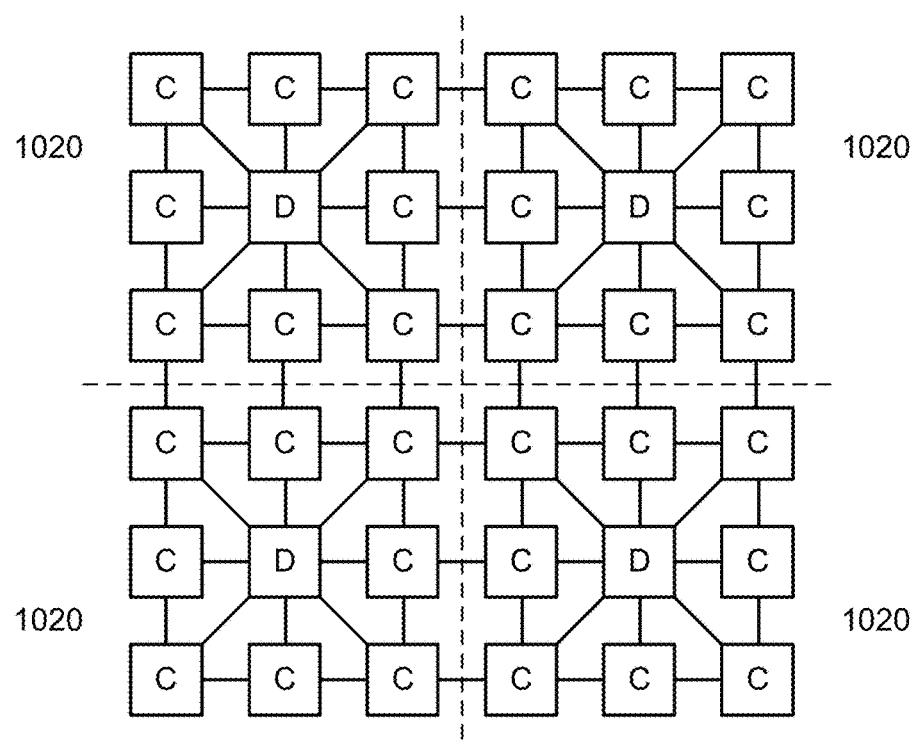

FIG. 10C shows a regular array of Tiles C with some Tiles that have special compute capability C1-C4. In this example mesh, the special Tiles replace some of the regular Tiles C in the array. The Tiles are arranged in clusters 1010A-D as indicated by the dashed lines. Each special Tile is surrounded by eight regular Tiles. The mesh of FIG. 10D is similar to FIG. 10C, except that the special compute Tiles C1-C4 are replaced by Tiles D that only perform data transfer. These Tiles D act as instruction-driven switches to allow data transfer between any of the eight surrounding compute Tiles C in the cluster 1020. Additional diagonal interconnects are added to allow data transfer between Tiles D and the corner Tiles C of each cluster 1020.

FIGS. 11A-11D are block diagrams of meshes with different network topologies. In these figures, an arrow between two Tiles indicates a data transfer path between the two Tiles. Arrows which touch only one Tile indicate a data transfer path between that Tile and L2 memory. The arrowheads indicate the direction of data transfer, whether unidirectional or bidirectional. In FIG. 2A, the network interconnectivity of the Tiles was based on a rectangular array. Each Tile was connected to its immediate neighbors. The edge Tiles were also connected to L2 memory. This was just an example. Tiles could be connected to different numbers of other Tiles, for example. Other examples are described below.

Figure 11A:
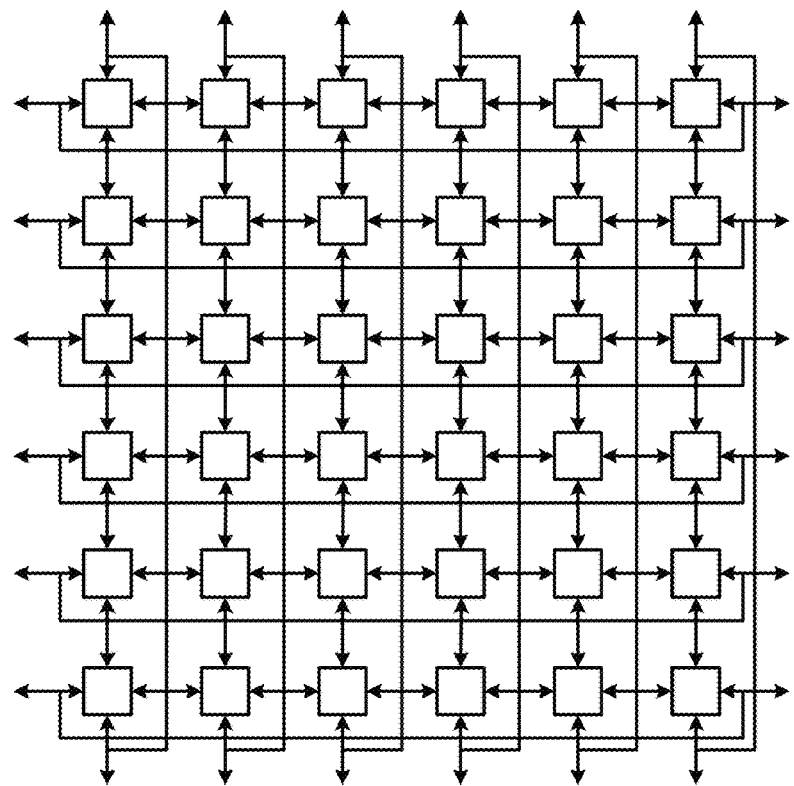
FIGS. 11A-11D are block diagrams of meshes with different network topologies.
Figure 11B:
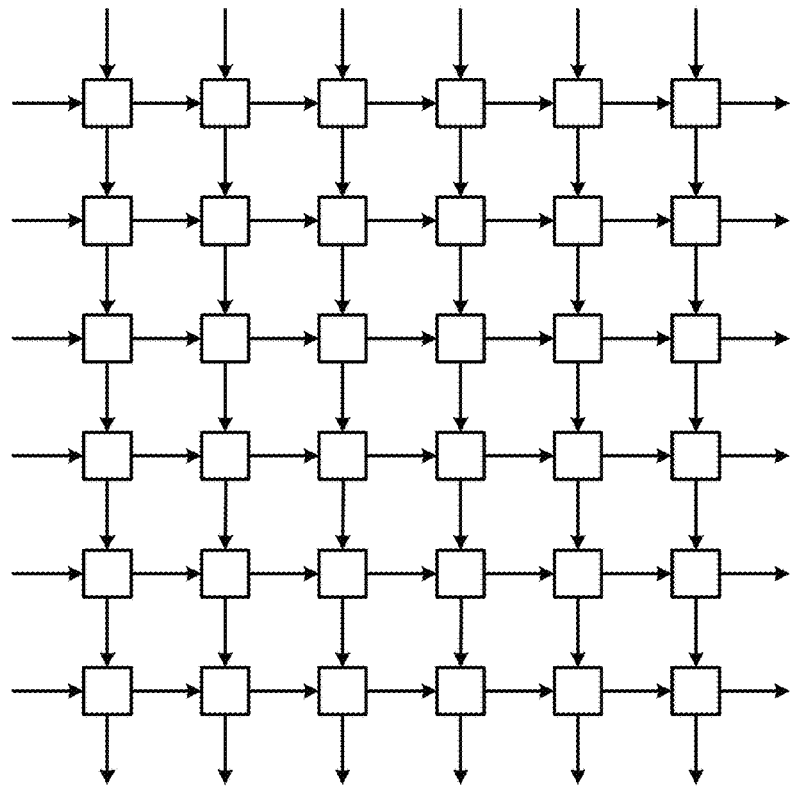

The mesh in FIG. 11A has the same network topology as in FIG. 2A, except that the edge Tiles are also connected to each other. Thus, data may be transferred between the leftmost and rightmost Tiles in any row and between the top and bottom Tiles in any column. In this example, all data links are bidirectional. The mesh in FIG. 11B has the same network topology as in FIG. 2A, except that all of the data links are unidirectional. Data has a preferred direction of flow from the top and left, to the bottom and right. This reduces the number of data transfer paths by half.

Figure 11C:
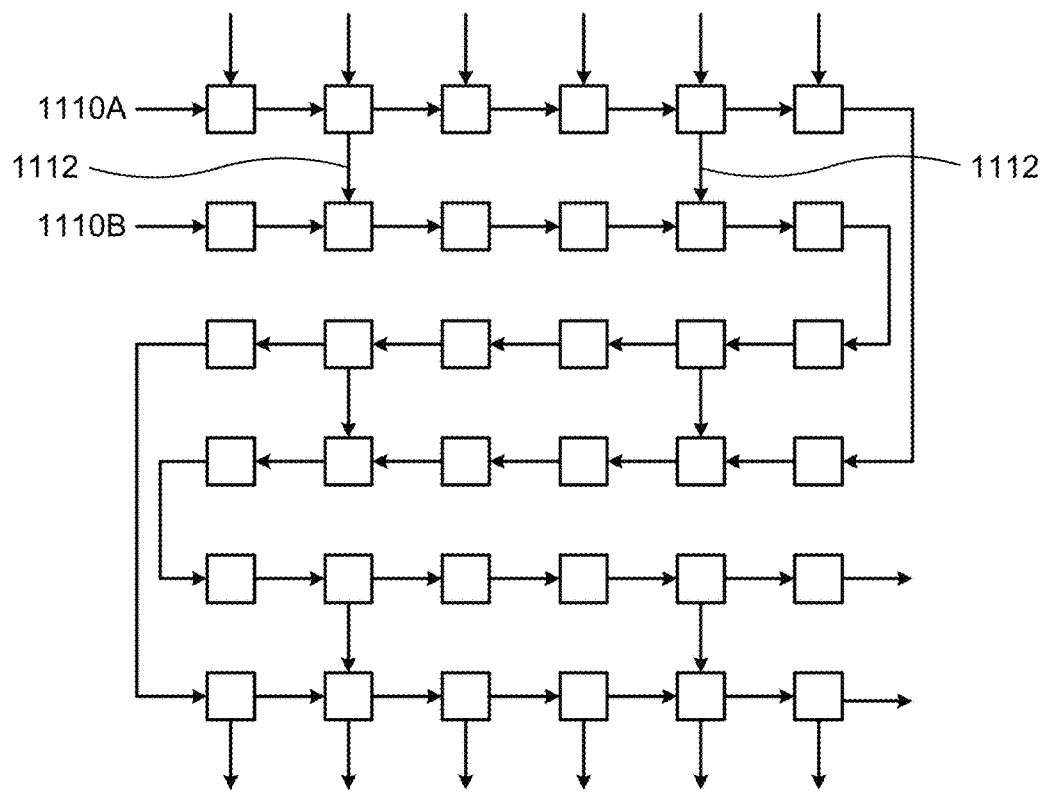

In FIG. 11C, the preferred direction of data flow is along two parallel tracks 1110A and 1110B, which snake from the upper left to the lower right. Every so often there are bridges 1112 to allow data transfer between the two tracks 1110.

Figure 11D:
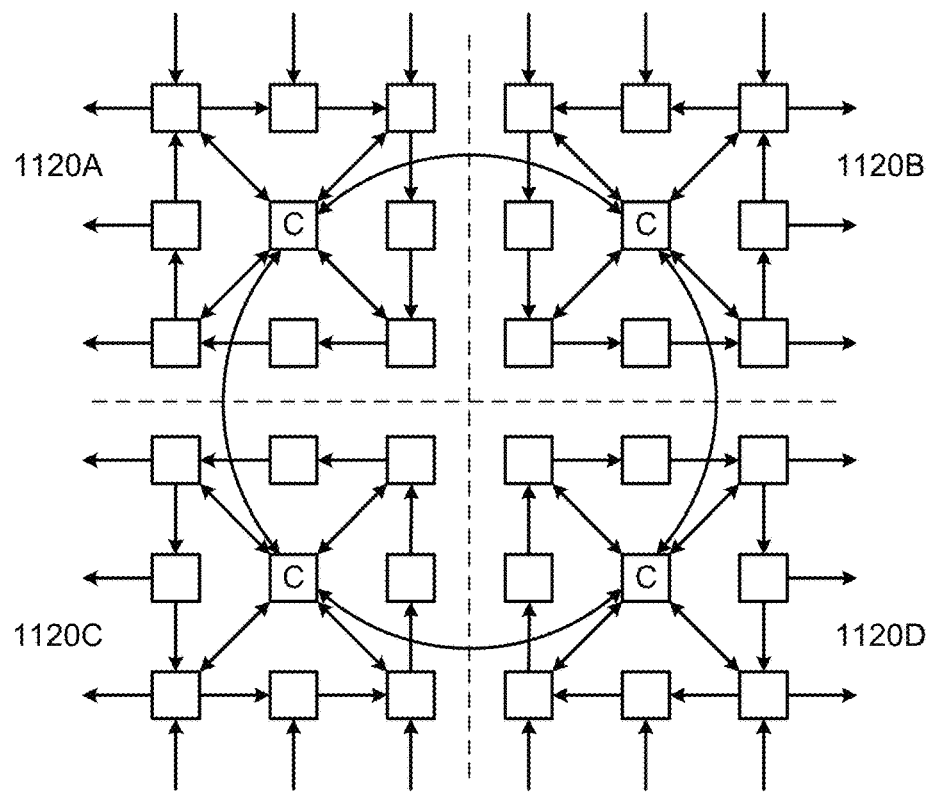

The network topology of FIG. 11D is based on clusters 1120. For each cluster 1120, a set of edge Tiles may receive data from L2 memory and another set of edge Tiles may transmit data to L2 memory. The Tiles in the cluster are arranged in a ring in a direction from the Tiles receiving data from L2 memory to the Tiles transmitting data to L2 memory. For example, in cluster 1120A, the top three Tiles can receive data from L2 memory and the left three Tiles can transmit data to L2 memory. The eight outer Tiles in the cluster form a ring with data flow in the clockwise direction. Thus, data that enters the cluster from L2 memory may be processed by the Tiles in the ring before exiting the cluster back to L2 memory. The center Tile C may transfer data to and from any of the corner Tiles in the cluster. It may also transmit data around a higher level ring to the other center Tiles of the other clusters 1120.

Figure 12A:
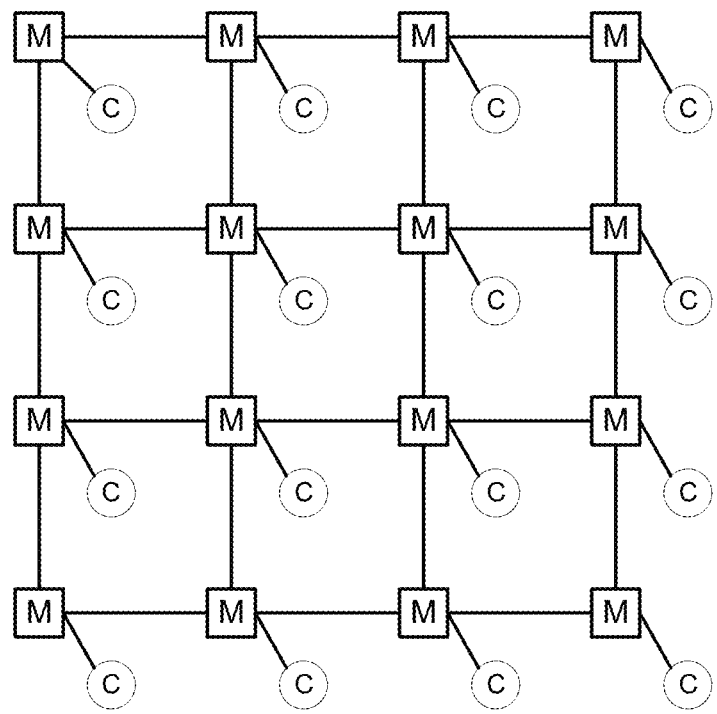
FIGS. 12A-12C are block diagrams of meshes with different arrangements of Tile memories.
Figure 12B:
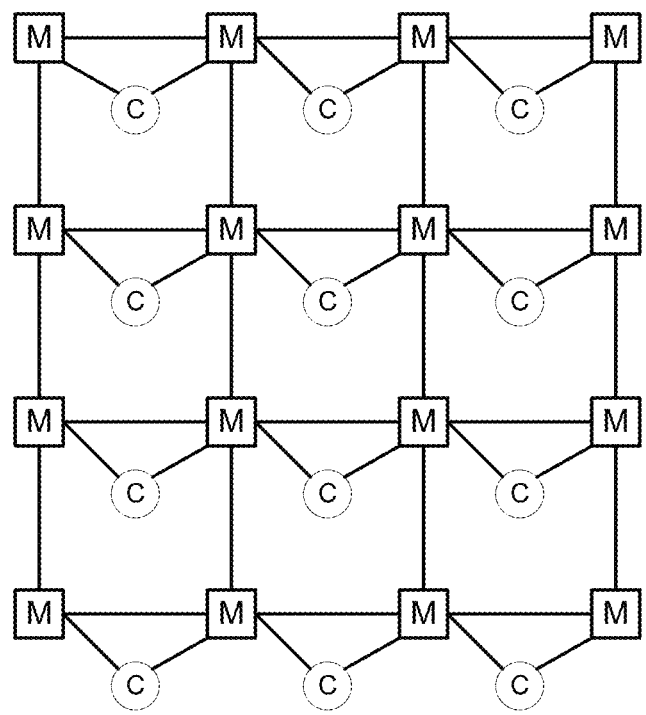
Figure 12C:
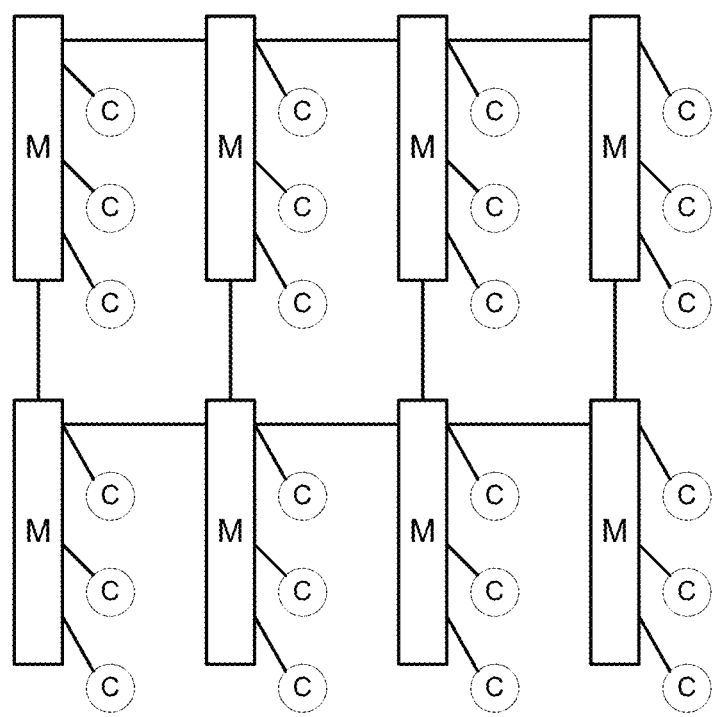

FIGS. 12A-12C are block diagrams of meshes with different arrangements of Tile memories. Tile memories are the local memory accessed by the Tiles (e.g., L1 memory in FIG. 2A). In these figures, the rectangle M represents a Tile memory and the circle C represents a Tile compute capability. The lines between M's are data transfer paths between memories. The lines between M and C indicate that compute capability C loads and stores data from that memory for its computation.

FIG. 12A shows the architecture described previously in FIG. 2. Each Tile memory M may transfer data to its adjacent neighbor. (In FIG. 2B, data may be transferred from L1 memory 282 to the L1 memory of an adjacent Tile.) Each of the compute capabilities C uses data from a dedicated local memory M. (In FIG. 2B, the compute pipeline 285 reads operands from L1 memory 282 and writes the result of its computation to L1 memory 282).

In FIG. 12B, the memories M are connected to each other in the same network as FIG. 12A. However, the compute capabilities C are each connected to two neighboring memories M. As a result, a compute pipeline C may read operands from one memory M, perform a computation and write the result to the adjacent memory. This saves a step of data transfer between the two memories.

In FIG. 12C, multiple compute capabilities C share a memory M. This is another way to transfer the result computed by one pipeline C to the input of another compute pipeline, without requiring an explicit data transfer between separate memories.

FIGS. 10-12 show some examples of different architectures for the mesh of Tiles. Other variations will be apparent. For example, the meshes could be irregular rather than a regular pattern. Furthermore, the mesh architecture could be instruction-driven or hardware configurable. For example, assume that all Tiles have capabilities C1, C2 and C3. The Tiles may be hardware configurable (like FPGAs) so that, if the architecture of FIG. 10A or 10B was desired, the Tiles could be configured for the specific capability C1, C2 or C3. Alternatively, the Tiles may be configured for capabilities C1, C2 or C3 by software instructions in the computer program. The unutilized capabilities may be idled, powered down or even disconnected (either temporarily or permanently). The same is true for the network topology and the memory architecture.

Figure 13:
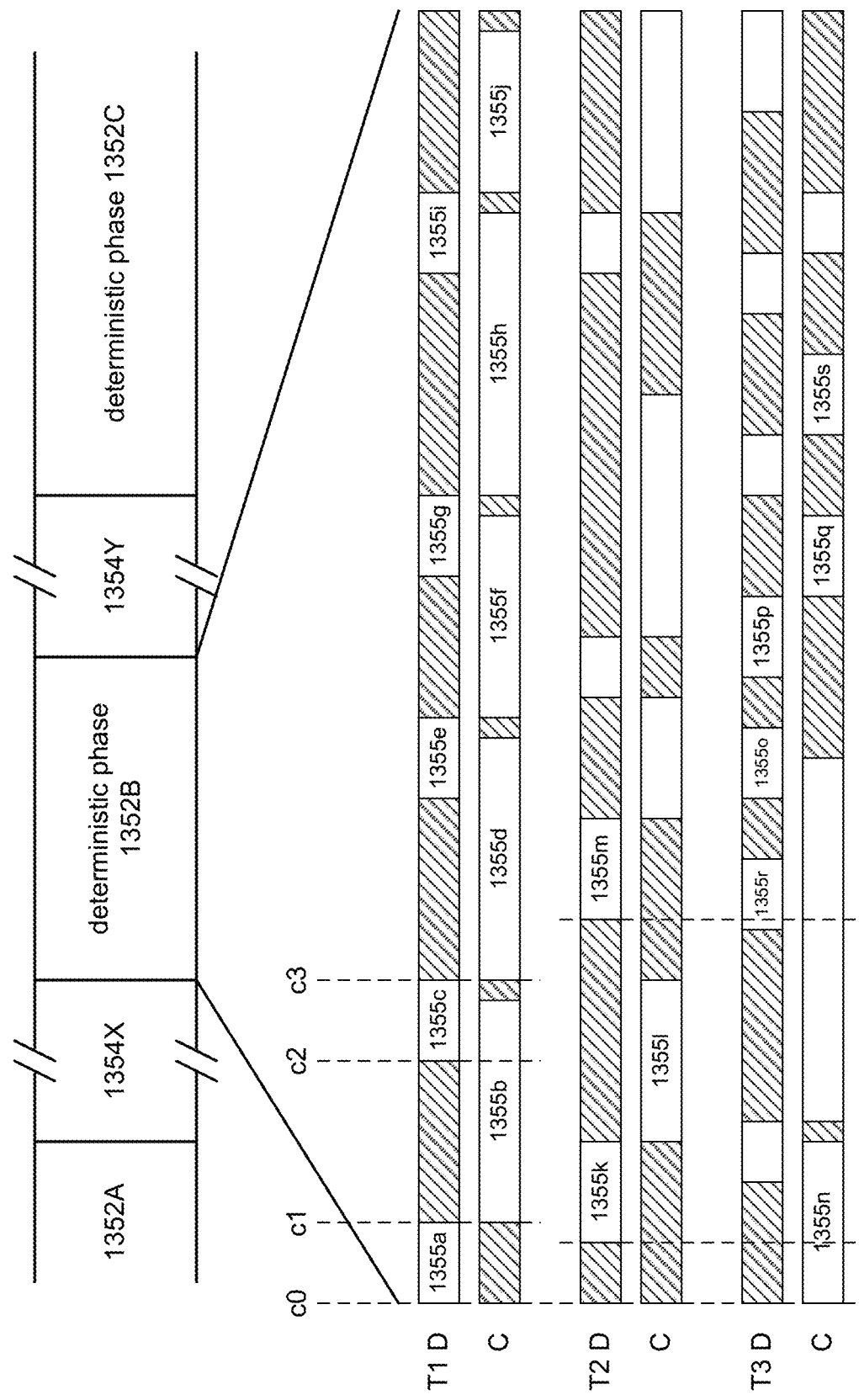
FIG. 13 illustrates partitioning a computer program into deterministic and non-deterministic phases.

FIG. 13 is a timing diagram illustrating a technique for static scheduling of instructions in an MLA. In FIG. 13, the compiler partitions the Tile instructions into one or more deterministic phases 1352A,B,C which typically utilize multiple Tiles. The instructions in a deterministic phase 1352 may be statically scheduled by the compiler. For example, a deterministic phase 1352 may include a series of computations required to implement a portion of the MLN, where the time required for each computation and associated data transfers is known. As a result, the compiler may statically schedule the Tile instructions within that deterministic phase relative to the other Tile instructions in the phase. The resulting computer program produced by the compiler then implements an allocation of instructions to Tiles and a schedule for executing the instructions as determined by the compiler, although these may not be expressly contained within the computer program. In the example of FIG. 1, the computations performed by layers 102A-D are allocated to groups 182A-D of Tiles as indicated. In addition, all of the Tile instructions (including both for computation and for data transfer) are executed in a single deterministic phase.

The computer program may also include non-deterministic phases 1354X,Y. For example, non-deterministic phases 1354 may include data fetch or instruction fetch from off-chip memory where the time required to execute the operation varies too much to allow reliable synchronization with other operations. Other examples include computations that occur off-chip, and conditions, branching and other programmatic constructs that depend on values not known until run-time. The breaks in the rectangles for the non-deterministic phases 1354 indicate that the timing is not deterministic, whereas the deterministic phases 1352 are represented by rectangles without breaks. In FIG. 13, the deterministic and non-deterministic phases are shown as alternating. This is not required. For example, deterministic and non-deterministic phases may execute concurrently.

FIG. 13 also shows more detail of deterministic phase 1352B, which shows the static schedule computed by the compiler for executing Tile instructions in this phase. The phase 1352B begins at some time when all of the Tiles are synchronized, which for convenience is marked as cycle c0 in FIG. 13. The Tiles may have circuitry that synchronizes the Tiles. For example, each Tile may monitor when it is ready to begin execution of a deterministic phase 1352B and then actual execution begins when all Tiles signal that they are ready. Alternatively, an external controller may synchronize the Tiles and start the deterministic phase 1352B when all Tiles are ready.

In this example, the instructions are executed by three Tiles, as denoted by T1, T2 and T3. Each Tile has two pipelines: a "D" pipeline for executing data transfer instructions and a "C" pipeline for executing compute instructions. The row labeled T1 D shows instructions executed by the Tile 1 D (data transfer) pipeline, and the row labeled T1 C shows instructions executed by the Tile 1 C (compute) pipeline. For this example, assume that all the data transfer instructions are instructions that load new data into that Tile for consumption by the compute pipeline. The white regions of each row denote the execution of instructions and the hashed regions indicate that the pipeline is idling or executing a NO-OP (no operation).

For Tile 1, instruction 1355a transfers data into Tile 1 and instruction 1355b then performs a computation that consumes that data. Instruction 1355b is dependent on instruction 1355a. Here, the T1 C pipeline is not required to continuously poll the T1 D pipeline at run-time for when the data is available, and run-time message passing between the pipelines is not required to indicate that the data is available. Rather, because the duration (i.e., time required to execute) of instruction 1355a is known, the compiler knows when the data will be available (for convenience, marked as cycle c1 in the figure) and can construct a static schedule in which instruction 1355b starts execution then. The duration of instruction 1355b is also known, so the compiler knows that compute instruction 1355d may start after instruction 1355b. In this case, the compiler determines a static schedule in which instruction 1355d starts at cycle c3. Compute instruction 1355d depends on data brought into the Tile by instruction 1355c. The duration of instruction 1355c is known, so the compiler knows that in the static schedule, instruction 1355c must start at cycle c2 or earlier. This pattern is repeated for pairs of data transfer instructions and compute instructions 1355e-f, 1355g-h, 1355i-j.

For Tile 2, compute instruction 1355l depends on data from data transfer instruction 1355k. However, instruction 1355k does not start immediately at cycle c0. Rather, it has a delayed start at cycle c4. This may be because the data transfer path required by instruction 1355k is occupied by some other data transfer instruction and is not available until cycle c4. The start time of instruction 1355k in the static schedule is not determined by run-time arbitration or contention mechanisms for the shared data transfer path. Rather, the compiler knows that the data transfer path is occupied since the compiler knows the start times and durations of all the instructions, so the compiler simply creates a static schedule in which instruction 1355k does not start until cycle c4 when the compiler knows the data transfer path will be available. Similarly, data transfer instruction 1355m has a delayed start time. Perhaps the T2 D pipeline is being used to transfer out the results of computation 1355l and does not become available until cycle c5.

For Tile 3, computation 1355n starts immediately at cycle c0. Perhaps the required data was loaded into Tile 3 during some prior phase. Data transfer instructions 1355o and 1355p load data for compute instruction 1355q. They are separated in time, perhaps because different pieces of data were not available or the data transfer paths were not available until those times. As a final example, data transfer instruction 1355r loads data for compute instruction 1355s. In the static schedule, the compiler places instruction 1355r well in advance of when the data is required, but this may be because that is when the data transfer path is available or perhaps the data was transferred out of the sourcing Tile in order to make room in that Tile.

Execution of the instructions according to the static schedule at run-time may be implemented in different ways. In one approach, the computer program includes an express schedule for the execution of the instructions. Continuing the example of FIG. 13, the computer program may specify that instruction 1355a executes at cycle c0, instruction 1355b at cycle c1, instruction 1355c at cycle c2, etc. Alternatively, the compiler may fill each instruction stream with NO-OPs to achieve the correct timing. A NO-OP (no operation) is an instruction that occupies a certain number of cycles without other activity. For example, the compiler knows that instruction 1355a will end at cycle c1 and instruction 1355b is supposed to begin at cycle c1. It may fill the space between cycles c0 and c1 with NO-OPs for the T1 C pipeline. The T1 C pipeline then just continuously executes instructions from its queue, and the NO-OPs ensure that instruction 1355b is executed according to the compiler's static schedule. In yet another approach, the static schedule may be implemented by hardware. The T1 C pipeline may just stall on the execution of instruction 1355b until the data from instruction 1355a is ready. The compiler knows that data will be ready at cycle c1 and, therefore, instruction 1355b will execute starting at cycle c1 even though the Tiles are unaware of the static schedule. Regardless of the implementation, for convenience, all of these situations will be described using the phrase "static schedule." Thus, a statement that the compiler statically schedules the instructions is intended to include all of the above implementations and is not meant to imply that the computer program expressly includes a scheduled time for each instruction.

In order to statically schedule the instructions in a deterministic phase, the compiler typically will know the duration of each instruction (i.e., how long each instruction takes to execute), the capabilities of each Tile (which Tiles can execute which instructions), the topology of data transfer paths to and from Tiles (including between Tiles, and between Tiles and on-chip memory), and the computations required and their dependencies (i.e., the MLN description). With this information, the compiler can schedule unconditional start times for the Tile instructions. Here, unconditional refers to run-time conditions. The execution order of statically scheduled instructions will not change as a result of run-time conditions, branching or dependence on input values. As a result, compute instructions may be scheduled for start times when all of the required data for the computation is known to be available and the compute pipeline is also known to be available. The need for run-time determination of whether data has arrived and whether the compute pipeline is available may be avoided. Analogously, data transfer instructions may be scheduled for start times when the data transfer path is known to be available. The need for circuitry to handle arbitrations, or to check for or resolve contentions and collisions on shared data transfer paths at run-time may be avoided. The need for routing tables and other circuitry to determine routing at run-time may also be avoided. The approach based on static scheduling described above is not restricted to the examples described above. For example, different network topologies of Tiles may be used. Other Tile meshes may also be statically scheduled, so long as the time required to execute computations and to transfer data between Tiles is deterministic and may be determined at compile time. Additional examples are described in U.S. application Ser. No. 16/840,216, "Machine Learning Network Implemented by Statically Scheduled Instructions, with Compiler," which is incorporated by reference herein in its entirety.

Figure 14:
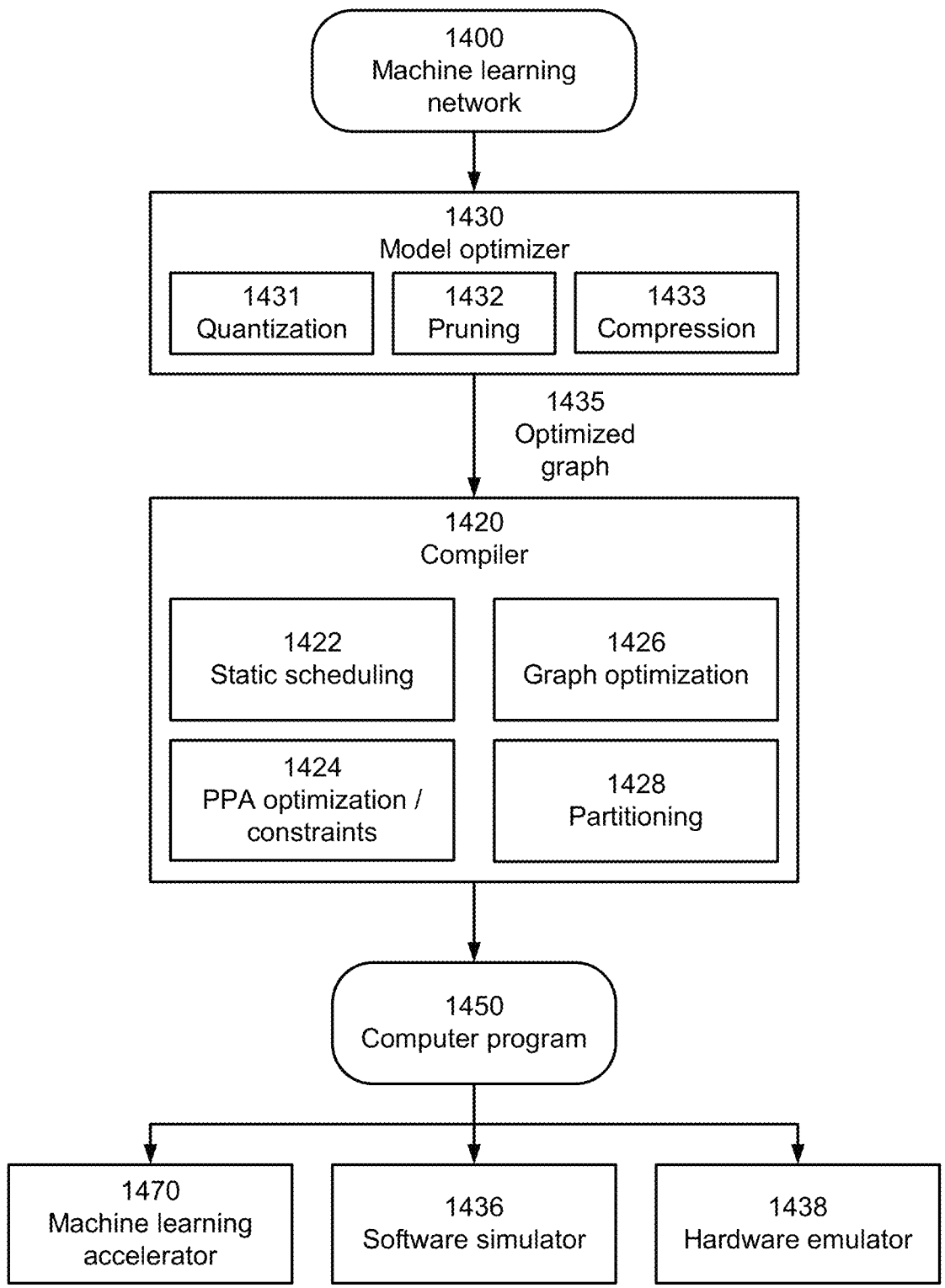
FIG. 14 is a block diagram of a software development environment including an ML compiler.

FIG. 14 is a block diagram of a software development environment including an ML compiler 1420. In this example, the software development environment also includes a model optimizer 1430. The model optimizer 1430 receives a description of the MLN 1400 and produces an optimized graph 1435 of the MLN. It may apply optimizations such as quantization 1431, pruning 1432 and/or compression 1433. Quantization 1431 reduces the resolution of calculated values. For example, floating point values may be quantized to a certain number of bits and then integer math used instead of floating point math. This reduces the complexity and power consumed by the Tiles. Pruning 1432 removes parts of the MLN that do not contribute significantly to the overall results. For example, if certain weights are zero or close to zero, those weighted interconnects may be pruned. Finally, because MLNs contain a large amount of data, compression may be used successfully to reduce data transfer bandwidths.

The resulting optimized description 1435 of the MLN may be expressed as a graph, in which the nodes of the graph represent nodes in the MLN and the edges of the graph represent the weighted interconnects. The compiler 1420 receives the optimized graph 1435 and produces the resulting computer program 1450. The compiler 1420 may perform operations including static scheduling 1422, PPA (power performance area) optimizations 1424, graph optimizations 1426 and/or partitioning 1428. Static scheduling 1422 of the appropriate instructions was described above.

PPA optimization 1424 includes different optimizations of the computer program 1450. For example, the allocation of MLN computations to Tiles may be optimized to reduce power consumption, to increase performance (such as reducing latency or increasing throughput) and/or to reduce area (e.g., number of Tiles used).

For a given graph representation of an MLN, the number of computations required to execute the MLN is fixed. As a result, in one approach, the compiler may optimize to increase the utilization of compute resources in the Tiles to keep the compute pipelines as busy as possible. However, for a Tile to execute a computation, the data for that computation must be available. This means that any prior computations must be completed and that those results must be transferred to the Tile doing the next computation. Thus, rather than focusing on computations, the compiler may optimize with respect to data transfer to reduce the wait times of computations. It may also allocate computations to Tiles in order to reduce data transfers between Tiles in the same mesh, to reduce data transfers from outside the MLA and/or to reduce data transfers that cross the boundary of the mesh (e.g., reducing data transfers between L1 and L2 memory and trying to keep all data in L1 memory).

The compiler 1420 may also optimize 1424 the computer program 1450, subject to constraints on power, performance, area and/or any of the quantities described above. Graph optimization 1426 includes analysis of the graph representing the MLN to prune, merge or quantize links, parameters, values, and layers to achieve better performance. Partitioning 1428 concerns mapping the computations in the MLN to an implementation on the MLA. This includes determining which computations are allocated to which Tiles and how data flows through the mesh of Tiles during computation. If there are multiple mosaics, it also includes determining which computations are allocated to which mosaics.

The resulting computer program 1450 may be loaded into memory for execution on a machine learning accelerator 1470. For example, one possible application is object detection. In this case, the inputs are images captured by a video camera. The MLN 1400 has been trained to identify certain objects in the video images. The computer program 1450 implementing the MLN is loaded onto memory that is accessible by the MLA 1470, which is implemented as a chip inside the camera. This way, images captured by the video camera may be immediately analyzed by the computer program 1450 running on the MLA 1470.

In addition to the MLA 1470, the computer program 1450 or parts of it may be run on a software simulator 1436 and/or hardware emulator 1438 (including FPGAs configured as MLAs). These may be used for product development, debugging and/or prototyping. For some purposes, a full simulation or emulation is not necessary. For example, to check that there are no collisions or conflicts between statically scheduled instructions, only the flow of data may be simulated or emulated. It is not necessary to compute actual values.

Components of the software development environment of FIG. 14 including the model optimizer 1430, compiler 1420, computer program 1450, and software simulator 1436 may each be implemented as instructions stored to a non-transitory computer-readable storage medium. The instructions may be executed by one or more processors to perform the functions attributed to the components as described herein.

Figure 15:
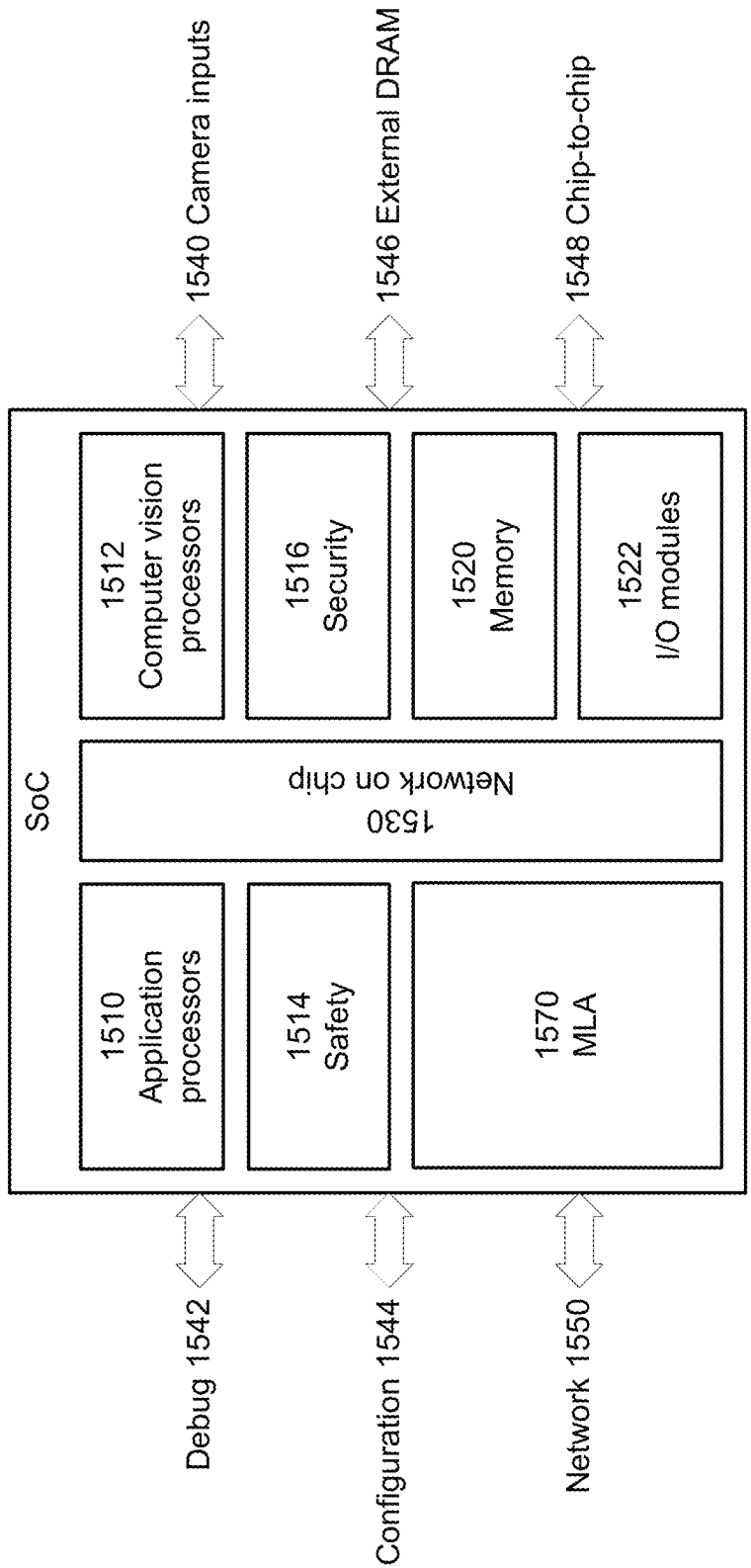
FIG. 15 is a block diagram of an integrated circuit product that includes an MLA.

FIG. 15 is a block diagram of an integrated circuit that includes an MLA 1570. In other words, other components may be included on the same die as the MLA. This example includes the following additional blocks: application processor 1510 (e.g., general purpose CPU running applications), computer vision processor 1512 (or other types of application-specific processors), safety 1514, security 1516, additional SRAM (memory) 1520 and input/output circuitry 1522. It also includes a network 1530 for communication between the different components. This type of semiconductor chip may be referred to as a system-on-chip (SoC).

The connections to the external world include camera inputs 1540 for the computer vision processors, ports for debug 1542 and configuration 1544, a connection 1546 to external memory (e.g., DRAM), chip-to-chip connections 1548, and network connections 1550 (e.g., Ethernet and PCIe).

The SoC of FIG. 15 may be combined with other components to perform various tasks in edge devices. Example applications for edge devices include automotive and other forms of transportation including autonomous transportation, agricultural, industrial, robotics, drones, surveillance and security, smart environments including smart cities, medical and personalized health. Example tasks include computer vision, image analysis, image understanding, speech recognition, audio analysis, audio understanding, natural language processing, classification and pattern recognition tasks. For edge devices, it may be desirable to perform certain tasks in real-time.

In addition to memory and other programmable processors, an edge device may also include sensors, such as cameras (both still image and video cameras), microphones, temperature sensors, pressure sensors and other types of sensors. The sensors may capture samples that are used as inputs to a computing pipeline within the edge device. For example, image samples may be input to the computer vision processors 1512, which perform initial operations such as edge detection and enhancement, contrast enhancement, motion detection, and optical flow. Raw and/or processed images may be then input to the MLA 1570 for analysis by the machine learning network. The MLA may also receive other inputs, such as metadata from other sources and data from other sensors. The application processors 1510 may also perform various functions in the overall pipeline and may also serve as a master controller that coordinates operation of the MLA and the other programmable processors in the pipeline.

Edge devices may be portable with less power available for computations compared to, for example, cloud-based server farms. It may also be desirable for the computing pipeline within the edge device to perform tasks without utilizing cloud-based or other remote compute resources. In some implementations, the MLA implements computations in the machine learning network at a performance of at least 50 TOPs (50 trillion operations per second) at a power consumption of not more than 5 watts. The performance may be increased by increasing the number of Tiles in the mesh or the number of Tile meshes on the die.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A method for generating a computer program that implements a machine learning network on a machine learning accelerator (MLA), the MLA comprising one or more meshes of interconnected Tiles implemented on a semiconductor die, the method comprising:
   receiving a description of the machine learning network;
   generating the computer program that implements the machine learning network on the MLA, wherein generating the computer program comprises generating Tile instructions that implement computations of the machine learning network on the Tiles and that implement data transfers for data used in the computations to and from the Tiles according to default routing rules, wherein generating the computer program further comprises:
      partitioning the Tile instructions into one or more deterministic phases each utilizing multiple Tiles;
      statically scheduling the Tile instructions within each deterministic phase relative to the other Tile instructions in the same deterministic phase;
   performing a simulation of the one or more deterministic phases of the computer program;
   detecting during the simulation, a routing conflict associated with at least one of the data transfers;
   updating the computer program in a manner that avoids the routing conflict; and
   outputting the computer program.

2. The method of claim 1, wherein the Tiles of the MLA each include integrated L1 memories, and wherein the MLA further includes L2 memories external to the Tiles, wherein the MLA further comprises data paths between respective L1 memories of adjacent Tiles, and between the L2 memories and the L1 memories of Tiles adjacent to the L2 memories, and wherein the Tile instructions for implementing the data transfers comprise a sequence of data transfer instructions to transfer data from a source memory to a destination memory through one or more intermediate memories via the data paths.

3. The method of claim 1, wherein generating the Tile instructions comprises:
   generating computation instructions for execution by the Tiles, the computation instructions for implementing the computations of the machine learning network;
   identifying a source memory and a destination memory for each of the data transfers for transferring the data used in the computations to and from the Tiles;
   for each of the data transfers, determining respective data paths between the source memory and the destination memory according to the default routing rules; and
   generating data transfer instructions for execution by the Tiles to implement the data transfers according to the respective data paths.

4. The method of claim 3, wherein determining the respective data paths according to the default routing rules comprises:
   determining a sequence of transfers from the source memory to the destination memory through one or more intermediate memories that are positioned in a direct path between the source memory and the destination memory.

5. The method of claim 1, wherein detecting the routing conflict comprises:
   detecting that in a given cycle of the simulation, a first data transfer instruction is scheduled to transfer first data into a destination memory that is scheduled to store data to be operated on in a future cycle.

6. The method of claim 1, wherein detecting the routing conflict comprises:

detecting that in a given cycle of the simulation, a first data transfer instruction is scheduled to transfer first data into a destination memory; and detecting that in the given cycle, a second data transfer instruction is scheduled to transfer second data into the destination memory.

7. The method of claim 1, wherein detecting the routing conflict comprises:

detecting that in a given cycle of the simulation, a first data transfer instruction is scheduled to transfer first data using a first data channel; and detecting that in the given cycle, a second data transfer instruction is scheduled to transfer second data using the first data channel.

8. The method of claim 1, wherein updating the computer program comprises:

updating a routing path of one of the data transfers to avoid the routing conflict, wherein updating the routing path comprises determining a sequence of transfers from a source memory to a destination memory through one or more intermediate memories that are positioned in an indirect path between the source memory and the destination memory that avoids the routing conflict.

9. The method of claim 1, wherein updating the computer program comprises:

modifying an execution time of a conflicting data transfer in a manner that avoids the routing conflict.

10. The method of claim 9, wherein modifying the execution time of the conflicting data transfer comprises:

inserting one or more no-operation instructions in the computer program prior to the execution time of the conflicting data transfer.

11. The method of claim 9, wherein updating the computer program comprises:

reordering one or more blocks of Tile instructions that includes at least one conflicting data transfer in a manner that avoids the routing conflict.

12. The method of claim 1, wherein updating the computer program comprises:

changing a memory port or memory partition utilized by a memory in one of the data transfers to avoid the routing conflict.

13. The method of claim 1, wherein updating the computer program comprises:

changing a data channel utilized by a memory in one of the data transfers to avoid the routing conflict.

14. The method of claim 1, wherein performing the simulation comprises:

identifying the one or more data transfers in the computer program;

generating a map of timing of each of the one or more data transfers indicating a memory location of data at each instruction cycle; and wherein detecting the routing conflict is based on the map.

15. A non-transitory computer-readable storage medium storing instructions for a compiler that generates a computer program for implementing machine learning network on a machine learning accelerator (MLA), the MLA comprising one or more meshes of interconnected Tiles implemented on a semiconductor die, the instructions when executed causing one or more processors to perform steps including:

receiving a description of the machine learning network;

generating the computer program that implements the machine learning network on the MLA, wherein generating the computer program comprises generating Tile instructions that implement computations of the machine learning network on the Tiles and that implement data transfers for data used in the computations to and from the Tiles according to default routing rules, wherein generating the computer program further comprises:

partitioning the Tile instructions into one or more deterministic phases each utilizing multiple Tiles;

statically scheduling the Tile instructions within each deterministic phase relative to the other Tile instructions in the same deterministic phase;

performing a simulation of the one or more deterministic phases of the computer program;

detecting during the simulation, a routing conflict associated with at least one of the data transfers;

updating the computer program in a manner that avoids the routing conflict; and outputting the computer program.

16. The non-transitory computer-readable storage medium of claim 15, wherein updating the computer program comprises:

updating a routing path of one of the data transfers to avoid the routing conflict, wherein updating the routing path comprises determining a sequence of transfers from a source memory to a destination memory through one or more intermediate memories that are positioned in an indirect path between the source memory and the destination memory that avoids the routing conflict.

17. The non-transitory computer-readable storage medium of claim 15, wherein updating the computer program comprises:

modifying an execution time of a conflicting data transfer in a manner that avoids the routing conflict.

18. The non-transitory computer-readable storage medium of claim 17, wherein modifying the execution time of the conflicting data transfer comprises:

inserting one or more no-operation instructions in the computer program prior to the execution time of the conflicting data transfer.

19. The non-transitory computer-readable storage medium of claim 17, wherein updating the computer program comprises:

reordering one or more blocks of Tile instructions that includes at least one conflicting data transfer in a manner that avoids the routing conflict.

20. A system comprising:

a machine learning accelerator (MLA) comprising:

one or more meshes of interconnected Tiles implemented on a semiconductor die, the one or more meshes of interconnected Tiles for implementing a machine learning network; and a controller for providing Tile instructions to the one or more meshes of interconnected Tiles in accordance with a computer program;

a non-transitory computer-readable storage medium storing instructions for a compiler that generates the computer program, the instructions when executed causing one or more processors to perform steps including:

receiving a description of the machine learning network;

generating the computer program that implements the machine learning network on the MLA, wherein generating the computer program comprises generating the Tile instructions that implement computations of the machine learning network on the Tiles and that implement data transfers for data used in the computations to and from the Tiles according to default routing rules, wherein generating the computer program further comprises:

partitioning the Tile instructions into one or more deterministic phases each utilizing multiple Tiles;

statically scheduling the Tile instructions within each deterministic phase relative to the other Tile instructions in the same deterministic phase;

performing a simulation of the one or more deterministic phases of the computer program;

detecting during the simulation, a routing conflict associated with at least one of the data transfers;

updating the computer program in a manner that avoids the routing conflict; and outputting the computer program.

21. The system of claim 20, wherein generating the Tile instructions comprises:

generating computation instructions for execution by the Tiles, the computation instructions for implementing the computations of the machine learning network;

identifying a source memory and a destination memory for each of the data transfers for transferring the data used in the computations to and from the Tiles;

for each of the data transfers, determining respective data paths between the source memory and the destination memory according to the default routing rules; and generating data transfer instructions for execution by the Tiles to implement the data transfers according to the respective data paths.

* * * * *